(12) United States Patent
Manabe

(10) Patent No.: US 7,208,787 B2
(45) Date of Patent: Apr. 24, 2007

(54) SEMICONDUCTOR DEVICE AND A PROCESS FOR MANUFACTURING A COMPLEX OXIDE FILM

(75) Inventor: Kenzo Manabe, Tokyo (JP)

(73) Assignee: NEC Corporation, Tokyo (JP)

( * ) Notice: Subject to any disclaimer, the term of this patent is extended or adjusted under 35 U.S.C. 154(b) by 447 days.

(21) Appl. No.: 10/242,725

(22) Filed: Sep. 13, 2002

(65) Prior Publication Data
US 2003/0011022 A1   Jan. 16, 2003

Related U.S. Application Data

(62) Division of application No. 09/653,446, filed on Aug. 31, 2000, now abandoned.

(30) Foreign Application Priority Data
Aug. 31, 1999 (JP) .................. 10-245491

(51) Int. Cl.
*H01L 29/76* (2006.01)
(52) U.S. Cl. ............... 257/295; 257/314; 257/410
(58) Field of Classification Search ............ 257/295, 257/314, 315, 316, 410; 438/201, 211, 257, 438/216, 261, 421, 591, 595, 785; 427/126.3, 427/125.3
See application file for complete search history.

(56) References Cited

U.S. PATENT DOCUMENTS

| | | | |
|---|---|---|---|
| 4,686,544 A * | 8/1987 | Ikeda et al. ............. 347/64 |
| 4,745,082 A * | 5/1988 | Kwok ..................... 438/178 |
| 4,839,097 A * | 6/1989 | Noi et al. ............. 252/520.21 |
| 5,134,451 A   | 7/1992 | Katoh |
| 5,187,638 A * | 2/1993 | Sandhu et al. ........... 361/313 |
| 5,225,286 A   | 7/1993 | Fujikawa et al. |
| 5,290,609 A * | 3/1994 | Horiike et al. ........... 438/396 |

(Continued)

FOREIGN PATENT DOCUMENTS

JP   62-120066   6/1987

(Continued)

OTHER PUBLICATIONS

H. Fujikawa wt al., "Effects of additive elements on electrical properties of tantalum oxide films", Journal of Applies Physics, vol. 75, No. 5, (Mar. 1, 1994), pp. 2538-2544.

(Continued)

*Primary Examiner*—Douglas W. Owens
(74) *Attorney, Agent, or Firm*—Sughrue Mion, PLLC

(57) ABSTRACT

A semiconductor device is prepared using an insulating film consisting of a tantalum-tungsten oxide crystal film, a tantalum-molybdenum oxide crystal film, or a laminated film where a silicon oxide, silicon oxynitride or silicon nitride film is laminated on the crystal film. The tantalum-tungsten oxide film is deposited on a substrate under an atmosphere of a mixture of the first material gas comprising tantalum, the second material gas comprising tungsten and an oxidizing agent. For improving a dielectric constant of the tantalum-tungsten or tantalum-molybdenum oxide crystal film, on a Ru substrate with (001) orientation is deposited a oxide crystal film, which is then heated in $N_2O$ plasma and subject to rapid thermal nitriding.

5 Claims, 19 Drawing Sheets

U.S. PATENT DOCUMENTS

| | | | | |
|---|---|---|---|---|
| 5,336,638 A | * | 8/1994 | Suzuki et al. | 438/240 |
| 5,642,213 A | * | 6/1997 | Mase et al. | 349/43 |
| 5,834,797 A | * | 11/1998 | Yamanaka | 257/57 |
| 6,010,744 A | * | 1/2000 | Buskirk et al. | 427/81 |
| 6,150,183 A | * | 11/2000 | Fukuda et al. | 438/3 |
| 6,319,730 B1 | * | 11/2001 | Ramdani et al. | 438/3 |
| 6,887,594 B2 | * | 5/2005 | Li et al. | 428/698 |

FOREIGN PATENT DOCUMENTS

| | | |
|---|---|---|
| JP | 10-22455 | 1/1998 |
| JP | 10-135418 | 5/1998 |
| JP | 11-87648 | 3/1999 |

OTHER PUBLICATIONS

Y. Fukuzumi et al., The 46th Applied Physics Association Meeting proceeding, (Spring 1999), No. 2, 30p- ZS-13, pp. 883.

H. Fujikawa et al., "Effects of Additive Elements on Electrical Properties of Tantalum Oxide Films", Materials Research Society Symposium Proceedings, vol. 378, (1995), pp. 1025-1030 with Abstract.

H. Kimura et al., "Extended x-ray absorption fine structure analysis of the difference in local structure of tantalum oxide capacitor films produced by various annealing methods", Applied Physics Letter, vol. 66, No. 17, (Apr. 24, 1995), pp. 2209-2211.

S. Sawada, "Thermal and Electrical Properties of Tungsten Oxide ($WO_3$)", Journal of the Physical Society of Japan, vol. 11, No. 12, (Dec. 1956), pp. 1237-1246.

E. Lefkowitz et al., "Phase Transitions in Tungsten Trioxide at Low Temperatures", Journal Solid State Chemistry, vol. 15, (1975), pp. 24-39.

J. Lin et al., "$Ta_2O_5$ thin films with exceptionally high dielectric constant", Applied Physics Letters, vol. 74, No. 16, (1999), pp. 2370-2372.

* cited by examiner

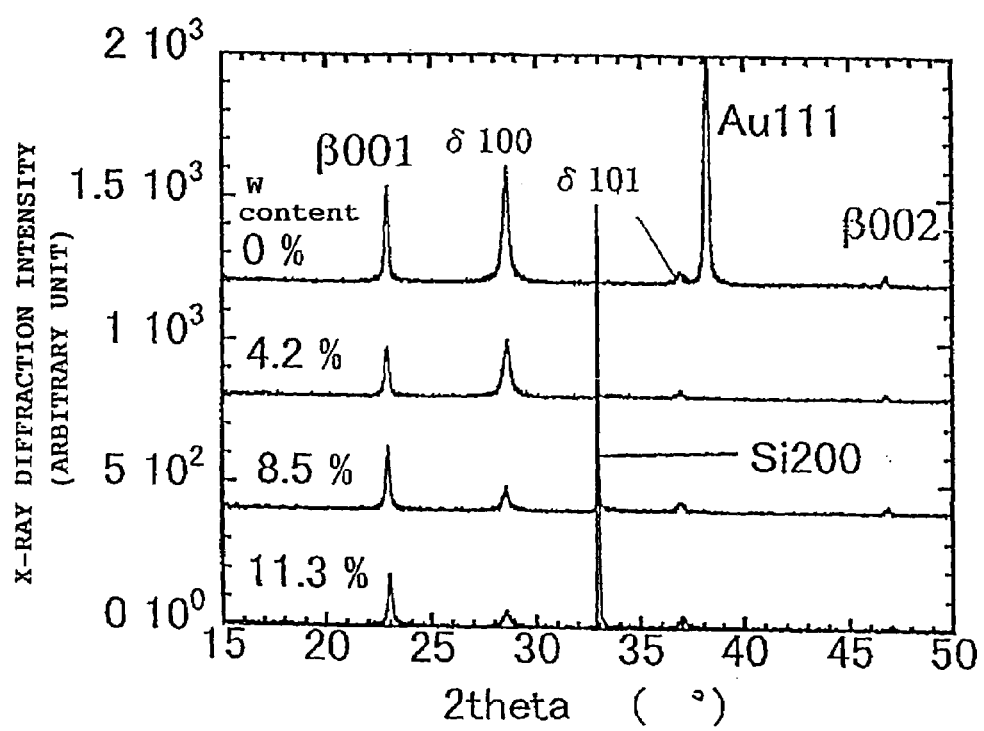
F I G. 2

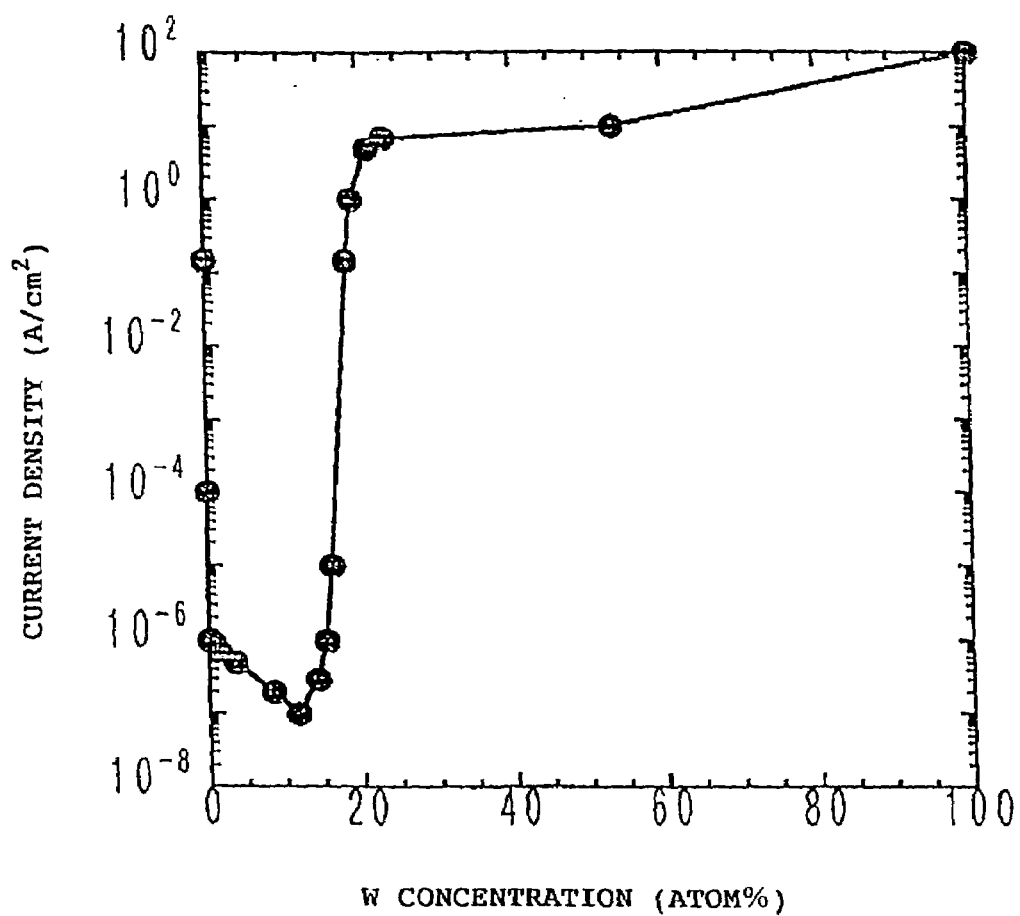
F I G. 3

US 7,208,787 B2

SEMICONDUCTOR DEVICE AND A PROCESS FOR MANUFACTURING A COMPLEX OXIDE FILM

This is a divisional of application Ser. No. 09/653,446 filed Aug. 31, 2000 now abandoned; the disclosure of which is incorporated herein by reference.

BACKGROUND OF THE INVENTION

1. Field of the Invention

This invention relates to a semiconductor comprising a oxide film as an insulating film which has good insulating property and to a process for manufacturing such a oxide film.

2. Description of the Prior Art

Recently, there have been attempts to reduce an equivalent oxide thickness $t_{ox}$ while maintaining a small leakage current for an insulating film, for achieving a further integrated, higher performance and further power-consumption saving semiconductor device. An equivalent oxide thickness $t_{ox}$ means a value obtained by reducing a real thickness t of a film with a dielectric constant $\epsilon$ into a thickness of a silicon oxide film with a dielectric constant $\epsilon_{SiO}$, as defined by the following equation.

$$t_{ox} = \epsilon_{SiO} t/\epsilon$$

For example, a gate insulating film in a semiconductor transistor with a 0.05 μm generation of gate length requires an equivalent oxide thickness $t_{ox}$ of 1 nm or shorter and a leakage current density of $10^{-6}$ A/cm$^2$ or less at a gate voltage of 1.2 V.

A capacity insulating film in a semiconductor memory with a 0.13 μm generation of gate length requires an equivalent oxide thickness $t_{ox}$ of 0.3 nm or shorter and a leakage current density of $10^{-8}$ A/cm$^2$ or less at an applied voltage of 1.2 V.

A silicon oxide film has been used for a gate insulating film in a semiconductor transistor or a capacity insulating film in a semiconductor memory. A silicon oxide film with a thickness of 1 nm or less, however, has a current density of higher than 10 A/cm$^2$ even for a direct tunneling current alone at an applied voltage of 1 V, and thus cannot be used in a next generation of semiconductor transistor or semiconductor memory. It has been, therefore, investigated to use a metal oxide with a higher dielectric constant as an insulating film.

For example, amorphous tantalum pentoxide ($Ta_2O_5$) is highly insulative with a relatively higher dielectric constant (25 to 26) and has been, therefore, investigated for its application to the above gate insulating film or a capacity insulating film. However, when applying a voltage of 1.2 V to an amorphous $Ta_2O_5$ sample with an equivalent oxide thickness $t_{ox}$ of 1 nm (real film thickness of 6.5 nm), a leakage current density is $10^{-4}$ to $10^{-3}$ A/cm$^2$. The above performance requirement for a gate insulating film or capacity insulating film is, therefore, not satisfied.

In other words, for using amorphous $Ta_2O_5$ in a gate insulating film or capacity insulating film, it is necessary to improve a dielectric constant while maintaining insulating performance; to improve insulating performance while maintaining a higher dielectric constant; or to improve both insulating performance and a dielectric constant.

For example, crystallization has been studied as an attempt to improving a dielectric constant of the above amorphous $Ta_2O_5$; specifically, β-$Ta_2O_5$ obtained after crystallization exhibited a dielectric constant $\epsilon$ of 35 which is 1.4 times of that for amorphous $Ta_2O_5$. However, crystallized $Ta_2O_5$ exhibits 105 times of leakage current density compared with that for amorphous $Ta_2O_5$ in the same electric field. The above requirement cannot be satisfied by simple crystallization.

For improving a dielectric constant of crystallized $Ta_2O_5$, for example, Applied Physics Letter, Vol. 74 (1999), p. 2370(J. Lin and co-workers) has described a technique that β-$Ta_2O_5$ with (001) orientation is deposited on a Ru substrate; specifically, β-$Ta_2O_5$ is deposited on Ru with (001) orientation, the substrate is heated initially at 350° C. for 3 minutes under $N_2O$ plasma and then at 800° C. for 1 minute under RTN (rapid thermal nitrization) to provide β-$Ta_2O_5$ with a dielectric constant of 100 or more.

However, because of leakage current deterioration due to the above crystallization, the film thickness of β-$Ta_2O_5$ must be 0.85 nm or more as an equivalent oxide thickness for achieving a leakage current density of $10^{-8}$ A/cm$^2$ or less at an application voltage of 1V.

On the other hand, addition of tungsten oxide ($WO_3$) or yttrium oxide ($Y_2O_3$) to amorphous $Ta_2O_5$ has been attempted for improving insulating performance of amorphous $Ta_2O_5$. Journal of Applied Physics, Vol. 75 (1994), p. 2538 (H. Fujikawa and co-workers) and Materials Research Society Symposium Proceedings, Vol. 378 (1995), p. 1025 (H. Fujikawa and co-workers) have reported that addition of 2 to 6 atom % of $WO_3$ or 10 to 30 atom % of $Y_2O_3$ to amorphous $Ta_2O_5$ can significantly improve a leakage current in comparison with amorphous $Ta_2O_5$.

However, within a range where the amount of the dopant is sufficient to effectively reduce a leakage current, a dielectric constant is lower than that for amorphous $Ta_2O_5$. Thus, a real film thickness corresponding to an equivalent oxide thickness of 0.5 nm becomes approximately 2.4 nm while an electric field to a metal oxide at an applied voltage of 1.2 V becomes approximately 5 MV/cm. In such a status, a leakage current density for $Ta_2O_5$—$WO_3$ or $Ta_2O_5$—$Y_2O_3$ is $10^{-5}$ A/cm$^2$ or higher due to a tunneling current, so that a requirement for an insulating property is not met.

Thus, attempts to date for improving a dielectric constant of $Ta_2O_5$ and insulating performance have been failed. For other high dielectric materials, a requirement for an insulating property has not been met. For example, a real thickness of a BST film must be 20 nm or less for realizing 0.3 nm or less of an equivalent oxide thickness. Thinning of the BST film, however, causes deterioration in an insulating property. For example, the 46th Applied Physics Association Meeting proceeding No. 2, p. 883: 30p-ZS-13, Spring 1999 (Y. Fukuzumi and co-workers) has described that when a BST has a real thickness of 20 nm, a leakage current density is $10^{-6}$ A/cm$^2$.

As described above, there has not been to date achieved a metal oxide meeting insulating performance and a dielectric constant required for a gate insulating film in a semiconductor transistor with a 0.05 μm generation of gate length and for a capacity insulating film in a semiconductor memory with a 0.13 μm generation of gate length.

SUMMARY OF THE INVENTION

An objective of this invention is to provide a semiconductor device comprising a oxide crystal film suitably used for, e.g., a gate insulating film in a semiconductor transistor with a 0.05 μm generation of gate length and a capacity insulating film in a semiconductor memory with a 0.13 μm generation of gate length, as well as a process for manufacturing the oxide film.

Physical Properties of Oxide Crystals $x\text{Ta}_2\text{O}_5$-$y\text{WO}_3$ and $x\text{Ta}_2\text{O}_5$-$y\text{MoO}_3$ We have found that a oxide crystal of $\text{Ta}_2\text{O}_5$ and $\text{WO}_3$, $x\text{Ta}_2\text{O}_5$-$y\text{WO}_3$, containing 18.5 atom % or less of tungsten (W) exhibits an improved dielectric constant and a higher insulating property in comparison with $\text{Ta}_2\text{O}_5$ crystal, irrespective of a substrate type. In particular, we have found that in the oxide crystal, 0.17% to 15.5% both inclusive of tungsten in the total metal atoms can exhibit a $10^{-5}$ times of leakage current density compared with a $\text{Ta}_2\text{O}_5$ crystal; furthermore, 8.3.% to 13.1% both inclusive of tungsten in the total metal atoms can exhibit an approximately $10^{-6}$ times of leakage current density compared with a $\text{Ta}_2\text{O}_5$ crystal.

An insulating property required for a gate insulating film in a semiconductor transistor with a 0.05 μm generation of gate length, i.e., a leakage current density of $10^{-6}$ A/cm$^2$ or less in an equivalent oxide thickness of 0.5 nm when applying 1.2 V, can be achieved by using, as a gate insulating film, a tantalum-tungsten oxide film crystal containing 0.17% to 15.5% both inclusive of tungsten in the total metal atoms. Thus, a semiconductor transistor can be more integrated and more have more improved performance.

In the light of a process margin, the amount of tungsten in the total metal atoms in the oxide crystal is preferably 8.3% to 13.1% both inclusive.

We have also found that in a oxide crystal of $\text{Ta}_2\text{O}_5$ and $\text{MoO}_3$, i.e., $x\text{Ta}_2\text{O}_5$-$y\text{MoO}_3$, a certain amount (about 2%) or less of molybdenum (Mo) can improve insulating performance compared with $\text{Ta}_2\text{O}_5$ crystal without reducing a dielectric constant, irrespective of a substrate type.

It may be believed that reduction of oxygen defects in a film compared with $\text{Ta}_2\text{O}_5$ crystal in the presence of tungsten or molybdenum causes improvement in an insulating property, i.e., reduction in a leakage current density, compared with a $\text{Ta}_2\text{O}_5$ crystal when tungsten or molybdenum is contained in a certain amount or less in a oxide crystal of $\text{Ta}_2\text{O}_5$ and $\text{WO}_3$, i.e., $x\text{Ta}_2\text{O}_5$-$y\text{WO}_3$ or of $\text{Ta}_2\text{O}_5$ and $\text{MoO}_3$, i.e., $x\text{Ta}_2\text{O}_5$-$y\text{MoO}_3$.

Applied Physics Letter, Vol. 66 (1995), p. 2209 (H. Kimura and co-workers) describes that a leakage current in β-$\text{Ta}_2\text{O}_5$ film is caused mainly by oxygen holes in the film.

Thus, it may be speculated that the a leakage current is reduced by adding $\text{WO}_3$ or $\text{MoO}_3$ to $\text{Ta}_2\text{O}_5$ crystal because in a Ta site, Ta is substituted for $\text{W}^{6+}$ (ion radius: 0.060 nm) or $\text{Mo}^{6+}$ (ion radius: 0.059 nm) having a smaller ion radius in a hexa-coordination state than that of $\text{Ta}^{5+}$ ion, 0.064 nm, so that distortion within a crystal is reduced to inhibit formation of oxygen holes during crystallization.

In a oxide crystal of $\text{Ta}_2\text{O}_5$ and $\text{WO}_3$, i.e., $x\text{Ta}_2\text{O}_5y\text{WO}_3$, deterioration in an insulating property compared with $\text{Ta}_2\text{O}_5$ when the amount of tungsten is more than a certain value may be caused by segregation of crystallized $\text{WO}_3$ with a lower specific resistance (γ-$\text{WO}_3$) to, e.g., a grain boundary or by action of tungsten replacing in a tantalum site as a donor.

Journal of Physical Society of Japan, Vol. 11 (1956), p. 1237(S. Sawada) has described that a bulk structure of γ-$\text{WO}_3$ has a specific resistance of 1 KΩcm.

The following reason can be speculated for increase of a dielectric constant in a oxide crystal of $\text{Ta}_2\text{O}_5$ and $\text{WO}_3$, i.e., $x\text{Ta}_2\text{O}_5$-$y\text{WO}_3$, compared with a $\text{Ta}_2\text{O}_5$ crystal.

Major part of a dielectric constant in a metal oxide with a high dielectric constant is due to ion polarization. Since ion polarization depends on a way of atomic arrangement, i.e., crystallinity, a higher ion polarization requires good crystallinity, which may be maintained because an oxygen around a tantalum in a part of the $\text{Ta}_2\text{O}_5$ crystal is of a hexa-coordination state as is for an oxygen around tungsten in crystallized $\text{WO}_3$ (γ-$\text{WO}_3$) and in a hexa-coordination state, the ion radii of $\text{Ta}^{5+}$ and $\text{W}^{6+}$ are substantially equal (0.064 nm and 0.060 nm, respectively).

Journal of Solid State Chemistry, Vol. 15 (1975), p. 24(I. Lefkoitz and co-workers) has described that bulk γ-$\text{WO}_3$ exhibits a dielectric constant of 2000.

It may explain a higher dielectric constant of a oxide crystal of $\text{Ta}_2\text{O}_5$ and $\text{WO}_3$, i.e., $x\text{Ta}_2\text{O}_5$-$y\text{WO}_3$, than that of a $\text{Ta}_2\text{O}_5$ crystal.

Amorphous $x\text{Ta}_2\text{O}_5$-$y\text{WO}_3$ and oxide crystal $x\text{Ta}_2\text{O}_5$-$y\text{WO}_3$ used in this invention are considerably different in the following respects and are therefore different types of insulating materials. Specifically, within a range of tungsten amount in which a leakage current density of amorphous $x\text{Ta}_2\text{O}_5$-$y\text{WO}_3$ is reduced, a dielectric constant is also reduced, while a leakage current density of the oxide crystal $x\text{Ta}_2\text{O}_5$-$y\text{WO}_3$ of this invention exhibits an improved dielectric constant in the range. Preparation of a oxide crystal $x\text{Ta}_2\text{O}_5$-$y\text{WO}_3$ For depositing $x\text{Ta}_2\text{O}_5$-$y\text{WO}_3$, CVD(Chemical Vapor Deposition) can be preferably conducted using a material gas containing tantalum, a material gas containing tungsten and an oxidizing agent. Specifically, a capacity insulating part in a semiconductor device has a fine stack or trench structure for higher integration and a chemical vapor deposition technique can be employed for good step covering, leading to a highly-integrated memory. For preparing a so-called high-ε gate transistor in which a high dielectric material is used as a gate insulating film, it is necessary to deposit a high dielectric-constant layer leakage a lower temperature and with a good thickness control for inhibiting formation of a low dielectric-constant layer (e.g., a silicon oxide film) between a channel and the high dielectric-constant layer. In other words, the above two conditions may be satisfied by using material gases which are decomposed at a lower temperature and conducting chemical vapor deposition at a lower pressure. It is recommended in chemical vapor deposition to use an oxidizing gas containing nitrogen dioxide gas having higher oxidizability for adequately oxidizing metal atoms.

Application to a Capacity Insulating Film

In a current technique, a capacity insulating film in, e.g, a semiconductor memory is deposited on a metal crystal film or a conductive metal oxide for ensuring crystallinity. We have found that a tantalum-tungsten or tantalum-molybdenum oxide crystal film with a dielectric constant of 100 or more can be prepared by depositing a tantalum-tungsten or tantalum-molybdenum oxide crystal film on Ru with a (001) orientation, heating it under $\text{N}_2\text{O}$ plasma and then rapid thermal nitriding. As used herein, the term "a β-phase tantalum-tungsten or tantalum-molybdenum oxide crystal film" means a crystal film in which has a X-ray diffraction peak substantially similar to that in β-phase $\text{Ta}_2\text{O}_5$ and has the substantially same, but not strictly identical, crystal structure as β-phase of tantalum oxide. The term "a δ-phase tantalum-tungsten or tantalum-molybdenum oxide crystal film" may be understood as is above.

A higher dielectric constant in the above tantalum-tungsten or tantalum-molybdenum oxide crystal film is probably derived from the fact that the tantalum-tungsten or tantalum-molybdenum oxide crystal film prepared in the above process is highly (001)-oriented. In particular, when tungsten atoms were contained in 0.17% to 15.5% both inclusive in metal atoms in a tantalum-tungsten oxide crystal film or molybdenum atoms were contained in about 1% in metal atoms in a tantalum-molybdenum oxide crystal film, a leakage current density was reduced to about $10^{-5}$ times of that for a $Ta_2O_5$ crystal. It allows us to achieve an insulating property required for a capacity insulating film in a semiconductor memory with a 0.13 µm generation of gate length, i.e., a leakage current density of $10^{-8}$ A/cm$^2$ or less in an equivalent oxide thickness of 0.3 nm or less when applying a voltage of 1.2 V, which has not been achieved using a conventional metal oxide.

It is, therefore, possible to realize a semiconductor memory with a 0.13 µm generation of gate length by using a tantalum-tungsten or tantalum-molybdenum oxide crystal film as a capacity insulating film in the semiconductor memory, leading to further integration of a DRAM.

A DRAM exhibiting an operating speed equivalent to a conventional DRAM can be prepared by using an electrode made of a material selected from noble metals consisting of Ir, Pt, Ru, Os and Rh; a high melting-point metal compound TiN; and conductive oxides consisting of $RuO_2$, $RhO_2$, $OsO_2$, $IrO_2$, $ReO_3$ and $SrRuO_3$ or an electrode having a laminated structure of multiple layers made of two or more of the above materials, as an upper electrode on a tantalum-tungsten or tantalum-molybdenum oxide crystal film in preparing the above semiconductor memory.

It is because an unnecessary high specific-resistance layer does not form between the oxide crystal film and the upper electrode.

Application to a Gate Insulating Film

When depositing a tantalum-tungsten oxide crystal film containing tungsten atoms in 0.17% to 15.5% both inclusive in metal atoms or a tantalum-molybdenum oxide crystal film containing molybdenum atoms in about 1% in metal atoms on a crystal in which lattice match does not occur with the film or an amorphous, its dielectric constant may be improved (40 or more) and a leakage current density may be reduced to about $10^{-5}$ times, compared with a $Ta_2O_5$ crystal.

Thus, such a oxide film as a gate insulating film in a semiconductor transistor allows us to achieve an insulating property required for a gate insulating film in a semiconductor transistor with a 0.05 µm generation of gate length, i.e., a leakage current density of $10^{-6}$ A/cm$^2$ or less in an equivalent oxide thickness of 0.5 nm when applying a voltage of 1.2 V, which has not been achieved using a conventional metal oxide, leading to further integration of a semiconductor transistor.

When using the above oxide crystal film as a gate insulating film, a silicon oxide, silicon oxynitride or silicon nitride film can be inserted between the oxide film and a channel (silicon substrate) to stabilize a threshold of a semiconductor transistor and improve operation performance of the semiconductor transistor. It is because insertion of a silicon oxide, silicon oxynitride or silicon nitride film inhibits diffusion of metal atoms into the channel.

Furthermore, a semiconductor transistor with good properties can be prepared by using an electrode made of a material selected from noble metals consisting of Ir, Pt, Os, Ru and Rh; a high melting-point metal compound TiN; and conductive oxides consisting of $RuO_2$, $RhO_2$, $OsO_2$, $IrO_2$, $ReO_3$ and $SrRuO_3$ or an electrode having a laminated structure of multiple layers made of two or more of the above materials, as an upper electrode on a tantalum-tungsten or tantalum-molybdenum oxide crystal film in preparing the above semiconductor transistor.

It is because an unnecessary high specific-resistance layer does not form between the oxide crystal film and the upper electrode.

The above and other objects, features and advantages of the present invention will become apparent from the following description with reference to the accompanying drawings which illustrate examples of the present invention.

BRIEF DESCRIPTION OF THE DRAWINGS

FIG. 2 is a graph showing a x-ray diffraction spectrum of a tantalum-tungsten oxide film crystal used in a semiconductor device according to this invention;

FIG. 3 is a graph showing a relationship between a tungsten concentration and a leakage current density in a tantalum-tungsten oxide film crystal used in a semiconductor device according to this invention;

DETAILED DESCRIPTION OF PREFERRED EMBODIMENTS

Figure 1:
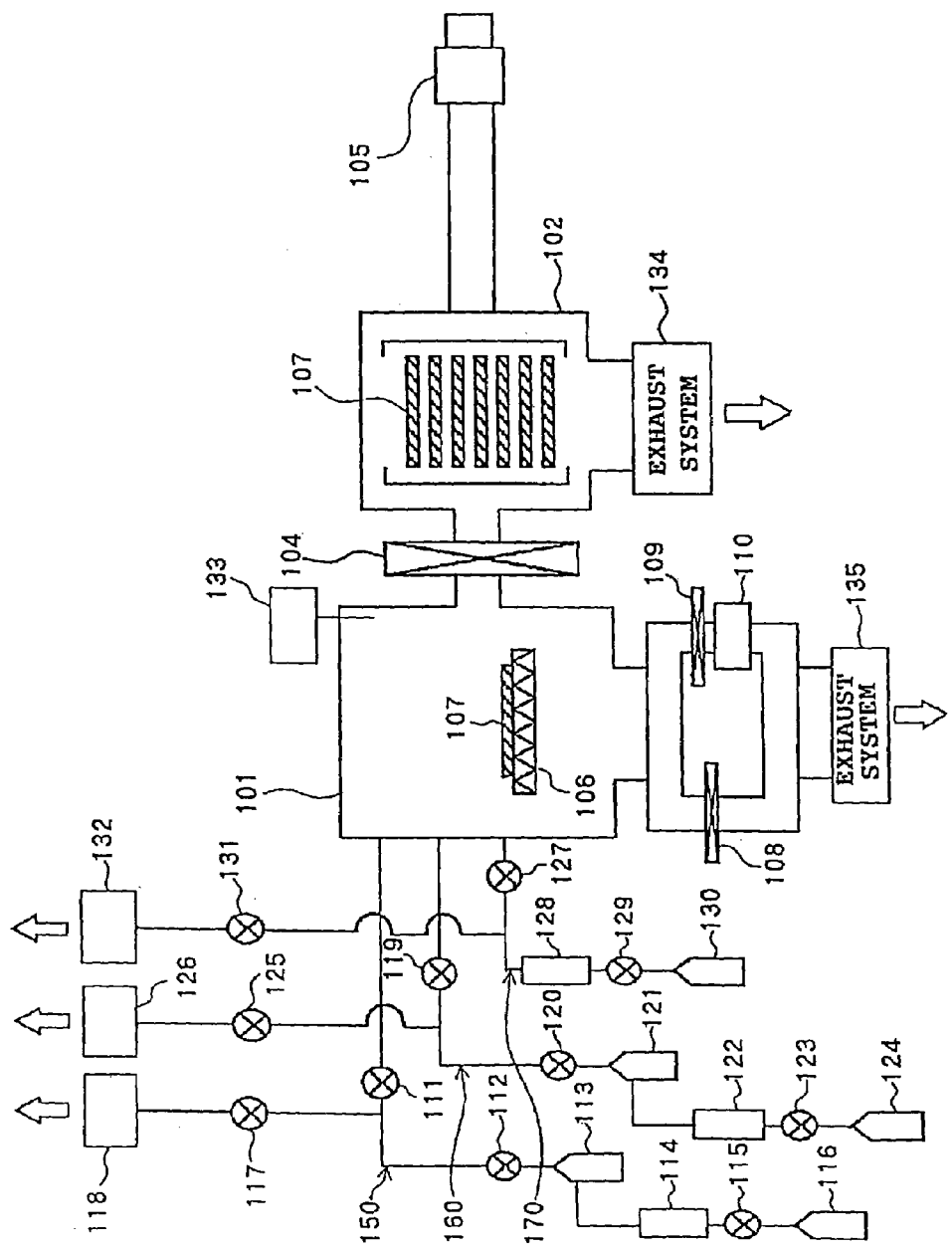
FIG. 1 is a block diagram illustrating an exemplary configuration for a chemical vapor deposition apparatus used in a process for manufacturing a semiconductor device according to this invention.

Description of an apparatus and a process for depositing film In this embodiment, a tantalum-tungsten oxide crystal film is deposited by reactive sputtering, CVD (Chemical Vapor Deposition), thermal oxidation of a tantalum-tungsten alloy or anodization.

There will be described a process for depositing a tantalum-tungsten oxide film by, for example, reactive sputtering. A tantalum-molybdenum oxide film can be also deposited in a similar manner.

For example, a magnetron sputter machine is used to deposit a tantalum-tungsten oxide film (or tantalum-molybdenum oxide film) by reactive sputtering. When sputtering is not conducted, chamber pressure is $5 \times 10^{-5}$ Pa.

During deposition, a mixture of argon and oxygen (e.g., a partial pressure ratio of argon/oxygen=90/10) is fed into a chamber to adjust chamber pressure to, for example, about $6 \times 10^{-1}$ Pa. After gas pressure becomes stable, a high frequency of 13.56 MHz is applied between a sintered tantalum-tungsten oxide (or a sintered tantalum-molybdenum oxide) and a susceptor equipped with an internal heater on which a substrate is placed.

When wafer temperature is 650° C. or lower, a deposited tantalum-tungsten oxide film (or tantalum-molybdenum oxide film) is amorphous, while when a wafer temperature is higher than 650° C., a deposited tantalum-tungsten oxide film (or tantalum-molybdenum oxide film) is of a β/δ mixed phase.

A tantalum-tungsten oxide film (or tantalum-molybdenum oxide film) deposited at 650° C. or lower becomes β/δ mixed phase after annealing as described later. A crystallized film may be annealed for compensating oxygen defects in the film.

There will be described a process for depositing a tantalum-tungsten oxide film by chemical vapor deposition.

When a tantalum-tungsten oxide film is deposited on a silicon substrate, silicon oxide film, silicon oxynitride film or silicon nitride film by chemical vapor deposition, deposition must be conducted at a low temperature for avoiding formation of a low dielectric film by inhibiting oxidation of the silicon substrate, the silicon oxide film, the silicon oxynitride film or the silicon nitride film.

It is, therefore, preferable to use material gases which can be deposited at 450° C. or lower, for deposition of a tantalum-tungsten oxide film by CVD. Such material gases include penta(dimethylamino)tantalum ($Ta[N(CH_3)_2]_5$), tantalum pentaethoxide ($Ta(OC_2H_5)_5$), tantalum chloride ($TaCl_5$) and tantalum fluoride ($TaF_5$) as a tantalum source as well as hexa(dimethylamino)tungsten ($W[N(CH_3)_2]_6$), tungsten hexaethoxide ($W(OC_2H_5)_6$), tungsten chloride ($WCl_6$) and tungsten fluoride ($WF_6$) as a tungsten source.

Although the following description will exemplify preparation of a sample using penta(dimethylamino)tantalum as a tantalum source and hexa(dimethylamino)tungsten as a tungsten source, a tantalum-tungsten oxide may be deposited with a substantially similar procedure under substantially similar conditions using tantalum pentaethoxide, tantalum chloride, tantalum fluoride, tungsten hexaethoxide, tungsten chloride or tungsten fluoride. When using tantalum chloride, tantalum fluoride, tungsten chloride or tungsten fluoride, no carbon atoms are present in a material gas, so that contamination of a channel with carbon can be avoided while depositing a tantalum-tungsten oxide film as a gate insulating film. Oxidizing agents which may be used include oxygen, ozone and nitrogen dioxide. When using an organic metal gas as a material gas, nitrogen dioxide is preferable because of its higher oxidizability.

There will be described a chemical vapor deposition apparatus (CVD apparatus) used for depositing the above tantalum-tungsten oxide film with reference to FIG. 1.

As shown in FIG. 1, the CVD apparatus consists of a sample processing chamber 101 and an exchange chamber 102. The exchange chamber can accommodate a plurality of wafers 107. There is a gate valve 104 between the sample processing chamber 101 and the exchange chamber 102, and gas in each chamber is evacuated via an exhaust system 134 or 135 consisting of a plurality of pumps. There is a wafer carrying means 105 for carrying the wafers 107 between the sample processing chamber 101 and the exchange chamber 102.

In the sample processing chamber 101, the wafers 107 are placed on a susceptor 106 equipped with an internal heater and heated to a given temperature with the susceptor 106. Over the wafers 107 are fed metal material gases and an oxidizing gas for depositing a metal oxide film on the upper surfaces of the wafers from gas feeding systems.

The gas feeding systems are the first, the second and the third gas feeding systems 150, 160, 170 for introducing three different material gases into the sample processing chamber 101. These gas feeding systems basically have the same configuration. Specifically, the first gas feeding system 150 comprises a material cylinder 113, stop valves 111, 112, 115, 117, a mass flow controller 114 and an exhaust system 118; the second gas feeding system 160 comprises a material cylinder 121, stop valves 119, 120, 123, 125, a mass flow controller 122 and an exhaust system 126; and the third gas feeding system 170 comprises a material cylinder 130, stop valves 127, 129, 131, a mass flow controller 128 and an exhaust system 132. The first and the second gas feeding systems 150, 160 are connected to nitrogen gas cylinders 116, 124, respectively.

Tantalum pentaethoxide and hexa(dimethylamino)tungsten having a relatively lower vapor pressure are fed from the first and the second gas feeding systems 150, 160 in which a gas can be fed with a carrier gas, while nitrogen dioxide is fed from the third gas feeding system 170.

The material cylinder 113 is heated to 80° C. which is the sublimation temperature of tantalum pentaethoxide, while the material cylinder 121 is heated to 120° C. which is the sublimation temperature of hexa(dimethylamino)tungsten. The mass flow controllers 114, 122, 128, pipes and the inside wall of the sample processing chamber 101 are heated to 150° C. for preventing solidification of material gases.

In this apparatus, each gas feeding system is independent of each other, so that a metal material gas is not in contact with an oxidizing gas. It can, therefore, avoid plugging in pipes/mass flow controllers and also allows material gases to be quantitatively and stably fed.

Parts to be in contact with material gases are heated to a temperature from a boiling point/sublimation temperature of a metal material gas to its decomposition point both inclusive by a heater. It can avoid plugging in pipes/mass flow controllers and also allows material gases to be quantitatively and stably fed. Heating the sample processing chamber 101 is particularly preferable because it effectively minimizes particles.

A pipe for exhausting under space of wafers 107 is branched into two ways which are again joined immediately before the exhaust system 135. One of the branched pipes is equipped with a gate valve 108 while the other is equipped with a gate valve 109 and a water-cooling trap 110. During deposition, the gate valve 108 is closed while the gate valve 109 is opened. Such a configuration may prevent solidification or liquefication of a metal material gas in the exhaust system 135 and prolong a service life of the exhaust system 135.

When deposition is not conducted, both gate valves 108 and 109 are opened. Such a configuration allows an exhaust rate to increase and a higher vacuum to be achieved. In the sample processing chamber 101, a vacuum gauge 133 is placed for monitoring its internal pressure. A pressure should be maintained at $10^{-4}$ Pa or lower when deposition is not conducted.

There will be described typical deposition conditions for a tantalum-tungsten oxide when using the above CVD apparatus.

Flow rates of carrier gases (nitrogen gas) for penta(dimethylamino)tantalum and hexa (dimethylamino)tungsten are adjusted such that a desired composition of tantalum-tungsten oxide is provided, while nitrogen dioxide as an oxidizing agent is fed to obtain a chamber internal pressure of about 50 Pa.

A substrate temperature is adjusted to about 350° C. to 450° C. when depositing a tantalum-tungsten oxide as a gate insulator, and about 350° C. to 700° C. when depositing it as a capacity insulating film.

In deposition with a CVD apparatus, again, when a wafer temperature is 650° C. or lower, a deposited tantalum-tungsten oxide film is amorphous, while when a wafer temperature is higher than 650° C., a deposited tantalum-tungsten oxide film is of a β/δ mixed phase. A tantalum-tungsten oxide film deposited at 650° C. or lower becomes β/δ mixed phase after annealing as described later. A crystallized film may be annealed for compensating oxygen defects in the film and removing impurities in the film.

There will be described a process for depositing a tantalum-tungsten oxide film using thermal oxidation of a tantalum-tungsten alloy.

For depositing a tantalum-tungsten oxide by thermal oxidation of a tantalum-tungsten alloy, a tantalum-tungsten alloy is first deposited using the CVD apparatus shown in FIG. 1 although when depositing a tantalum-tungsten alloy by sputtering, a tantalum-tungsten oxide target is replaced with a tantalum-tungsten alloy and pure argon gas is used as a feed gas.

For depositing a tantalum-tungsten alloy using a CVD apparatus, tantalum chloride or fluoride is used as a tantalum source; tungsten chloride or fluoride is used as a tungsten source; and a reducing agent such as hydrogen is fed in place of an oxidizing agent.

The tantalum-tungsten alloy is ¼ times as thick as a desired tantalum-tungsten oxide. The tantalum-tungsten alloy is oxidized by annealing it under an atmosphere of oxygen, a mixture of oxygen and ozone, or a combination thereof at 1 atm for about 10 minutes, wherein UV may be irradiated for generating chemically active oxygen radical O ($^3$P), O ($^1$D), active oxygen $O_2$($^1\Delta$) or ozone. A typical UV irradiation condition is 2.5 mW/cm$^2$ for 185 nm or 20 mW/cm$^2$ for 254 nm.

When a wafer temperature is 650° C. or lower during annealing, a tantalum-tungsten oxide film is amorphous, while when a wafer temperature is higher than 650° C., a deposited tantalum-tungsten oxide film is of a β/δ mixed phase. A tantalum-tungsten oxide film deposited at 650° C. or lower becomes a β/δ mixed phase after annealing as described later. A crystallized film may be annealed for compensating oxygen defects in the film and removing impurities in the film.

There will be described a process for depositing a tantalum-tungsten oxide film using anodization.

For depositing a tantalum-tungsten oxide film by anodization, on a substrate is first deposited a tantalum-tungsten alloy ¼ times as thick as a desired tantalum-tungsten oxide using sputter machine or the CVD apparatus illustrated in FIG. 1, as described for thermal oxidation of a tantalum-tungsten alloy.

While soaking a substrate on which a tantalum-tungsten alloy is deposited (anode) and an acid-resisting metal such as gold (cathode) in an aqueous solution of an electrolyte, i.e., a 0.02M aqueous solution of phosphoric acid, at 85° C., a positive voltage is applied to the anode immediately under the tantalum-tungsten alloy on the wafer (a wafer for a transistor, or a lower electrode for a DRAM) as described below.

A current density is kept constant, $2\times10^{-3}$ A/cm$^2$ until a steady voltage is obtained. The steady voltage Vf (V) is selected such that a current density is $6\times10^{-6}$ A/cm$^2$ or lower. Under the conditions, a tantalum-tungsten oxide deposited by anodization for 1 hour has a thickness of 1.65 Vf nm. In addition to an aqueous solution of phosphoric acid, a 0.01 M aqueous solution of citric acid may be used as an aqueous solution of an electrolyte. The tantalum-tungsten oxide film is amorphous and may become a β/δ mixed phase after annealing as described later. A crystallized film may be annealed as described later for compensation of oxygen defects in the film.

The following annealing procedure may be employed for crystallizing a tantalum-tungsten or tantalum-molybdenum oxide film deposited by reactive sputtering, chemical vapor deposition, thermal oxidation or anodization.

For crystallizing an amorphous tantalum-tungsten or tantalum-molybdenum oxide film, annealing may be conducted under an atmosphere of nitrogen, argon, oxygen, a mixture of oxygen and ozone, or a combination thereof at 1 atm for about 10 minutes while maintaining a substrate above 650° C., to provide a β/δ mixed phase as described later.

Using nitrogen, argon or a mixture of nitrogen and argon which is not oxidative during the above annealing, a tantalum-tungsten or tantalum-molybdenum oxide film may be crystallized while inhibiting oxidation of the layer directly under the tantalum-tungsten or tantalum-molybdenum oxide film. The procedure is, therefore, preferable for crystallizing a tantalum-tungsten or tantalum-molybdenum oxide film deposited as a gate insulator for a semiconductor transistor.

On the other hand, for compensating oxygen defects and removing impurities in a crystallized tantalum-tungsten or tantalum-molybdenum oxide film, annealing may be conducted under an atmosphere of oxygen or a mixture of oxygen and ozone at 1 atm for 10 minutes while maintaining a substrate temperature at 400° C. to 500° C.

UV may be irradiated for generating chemically active oxygen radical O ($^3$P), O ($^1$D), active oxygen $O_2$ ($^1\Delta$) or ozone in order to accelerate compensation of oxygen holes due to annealing and removing impurities in the film. A typical UV irradiation condition is 2.5 mW/cm$^2$ for 185 nm or 20 nW/cm$^2$ for 254 nm.

A tantalum-tungsten or tantalum-molybdenum oxide film deposited especially on Ru with a (001) orientation may be annealed in $N_2O$ plasma at 350° C. for 3 minutes and be subject to rapid thermal nitriding at 800° C. for 1 minute to achieve a higher dielectric constant of 100 or more as described above.

Description 1 of a Deposition Experiment: Properties on a Silicon Nitride Film

We studied dependence of a leakage current and a dielectric constant on a composition for a tantalum-tungsten oxide film crystal on a silicon nitride film.

A substrate used was an n-type silicon substrate (100) on which a silicon nitride film with an oxide-film reduced film thickness of 0.5 nm (real thickness: 0.9 nm) was deposited. A tantalum-tungsten oxide film was deposited by reactive sputtering. During reactive sputtering, the substrate was not heated, a mixture of argon and oxygen (a partial pressure ratio of argon/oxygen=90/10) was fed, a chamber internal pressure was 0.6 Pa and a high frequency power for an RF supply (frequency: 13.56 MHz) was 500 W. Nitrogen annealing was conducted at a substrate temperature of 800° C. and 1 atm for 10 minutes to crystallize the tantalum-tungsten oxide film.

FIG. 2 shows an X-ray diffraction spectrum for the tantalum-tungsten oxide film, where an X-ray used is CuK α (wavelength: 0.15418 nm). A symbol for each peak in the figure indicates a lattice plane corresponding to β- or δ-phase tantalum-tungsten oxide, Au or Si. As illustrated in FIG. 2, there are peaks at positions essentially indicating the presence of β- or δ-$Ta_2O_5$, by which crystallization can be confirmed. Thus, this film is of a β/δ mixed phase.

Figure 4:
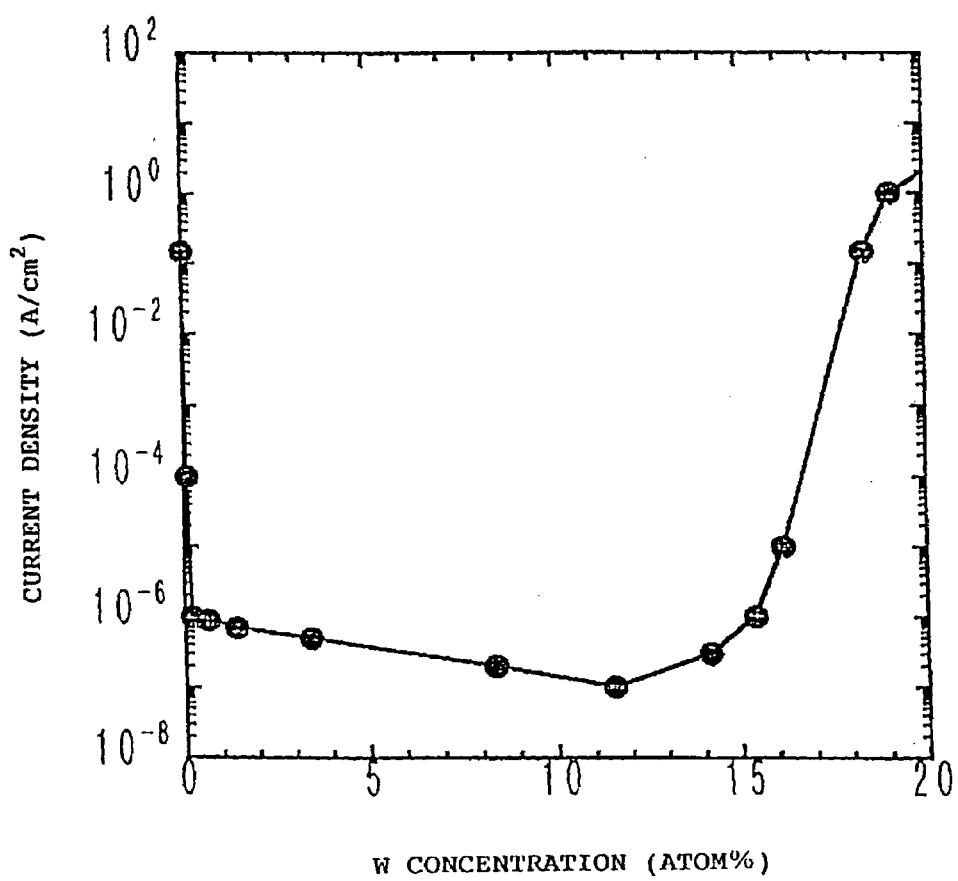
FIG. 4 is a graph showing an enlarged low tungsten concentration range in FIG. 3.
Figure 5:
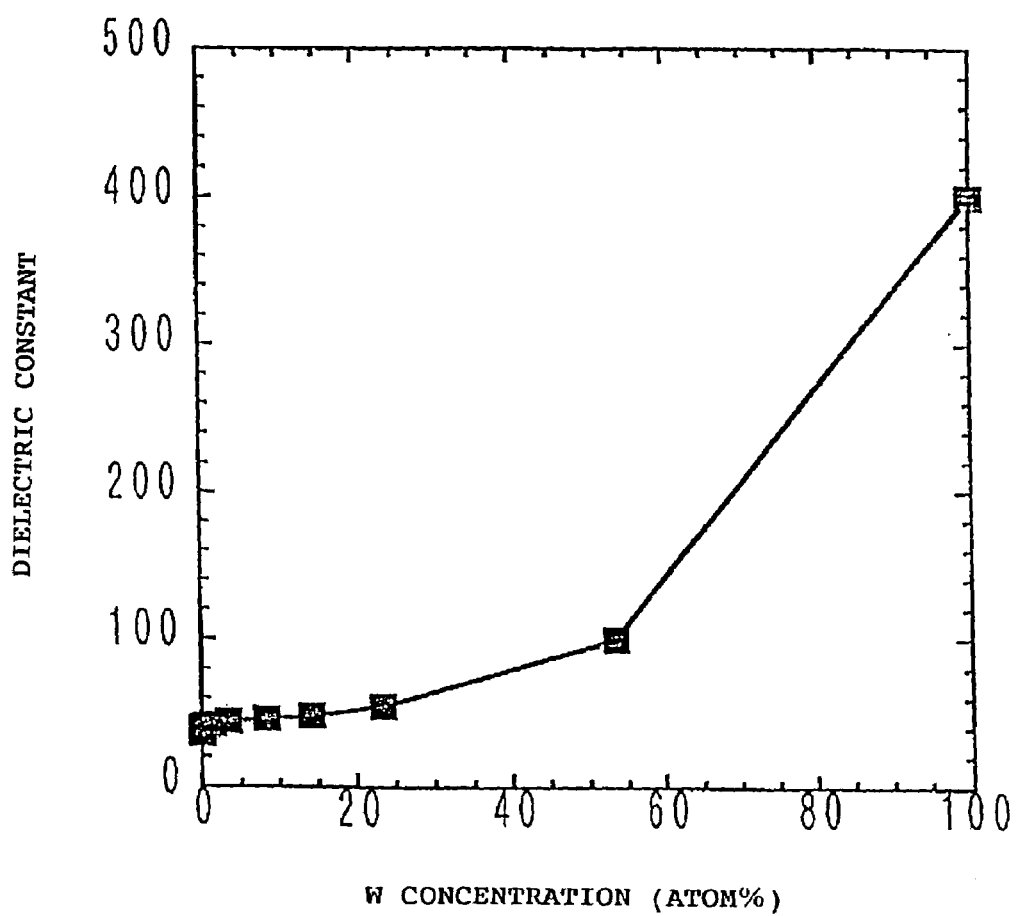
FIG. 5 is a graph showing a relationship between a tungsten concentration and a dielectric constant in a tantalum-tungsten oxide film crystal used in a semiconductor device according to this invention.
Figure 6:
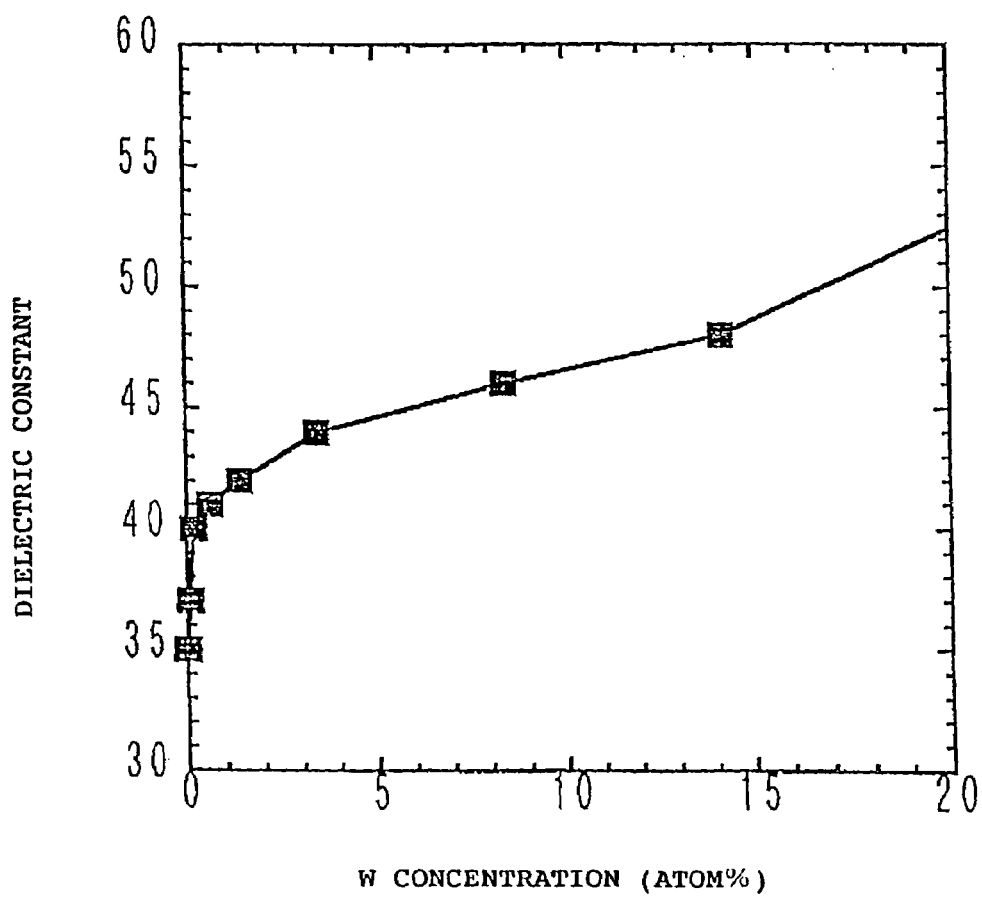
FIG. 6 is a graph showing an enlarged low tungsten concentration range in FIG. 5.
Figure 7:
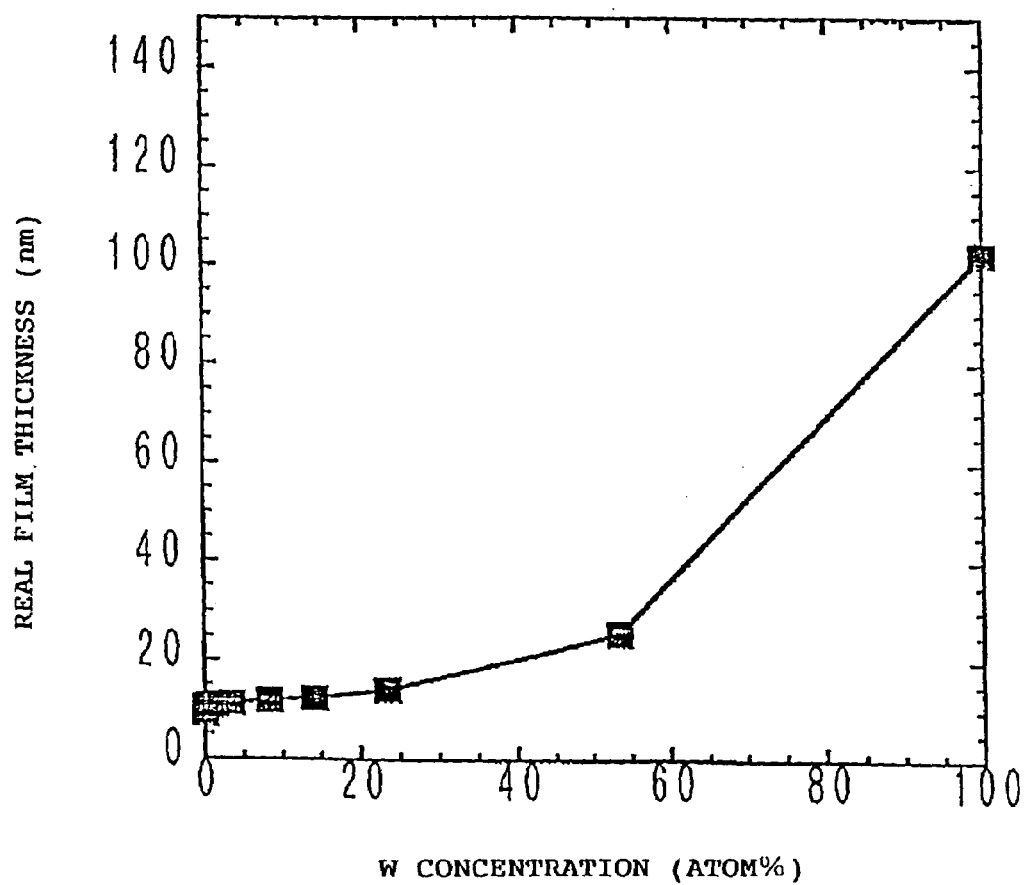
FIG. 7 is a graph showing a relationship between a tungsten concentration and a real film thickness in a tantalum-tungsten oxide film crystal used in a semiconductor device according to this invention.

FIGS. 3 and 4 show a leakage current density on a tungsten concentration in a sample on which gold is vapor-deposited as an upper electrode, while FIGS. 5 and 6 show dependence of a dielectric constant on a tungsten concentration on a composition. Herein, FIGS. 4 and 6 show enlarged low tungsten concentration regions in FIGS. 3 and 5, respectively. The tantalum-tungsten oxide film crystal was deposited such that it has an equivalent oxide thickness of 0.5 nm, and leakage current density data were obtained at an applied voltage of 1.2 V. FIG. 7 shows dependence of a real film thickness on a tungsten concentration on a composition in a tantalum-tungsten oxide film crystal. Since a silicon nitride film which is connected with the tantalum-tungsten oxide film in series has a thickness of as small as 0.9 nm, it is not insulative, but acts as a capacity film during application of a high frequency voltage (during measuring a capacity). A dielectric constant for a oxide film crystal was calculated, taking it into account.

As shown in FIGS. 3 and 4, a leakage current density decreases as a tungsten (W) content increases; reaches a minimum at 11.5% and again increases. When a tungsten content is 18.5% or less, the density is lower than a leakage current density for a $Ta_2O_5$ crystal. In particular, when a tungsten content is 0.17% to 15.5% both inclusive, a leakage current density is reduced to about $10^{-5}$ times or less compared with a $Ta_2O_5$ crystal. When a tungsten content is 8.3% to 13.1% both inclusive, a leakage current density is reduced to about $10^{-6}$ times or less compared with a $Ta_2O_5$ crystal. Furthermore, FIGS. 5 and 6 show that a dielectric constant increases as a tungsten (W) content increases.

Gold was vapor-deposited as an upper electrode for determining dependence of a leakage current density on an applied voltage, and a dielectric constant for a tantalum-molybdenum oxide film crystal (Mo/(Ta+Mo)=about 1%) on a silicon nitride film. The substrate used was an n-type silicon substrate (100) on which a silicon nitride film with an oxide-film reduced thickness of 0.5 nm (real thickness: 0.9 nm) was formed. The tantalum-molybdenum oxide film was deposited by reactive sputtering and annealed as described for the above tantalum-tungsten oxide film crystal, and its thickness was 1.0 nm as an equivalent oxide thickness (real thickness: 5 nm) and dielectric constant was 39.

Figure 8:
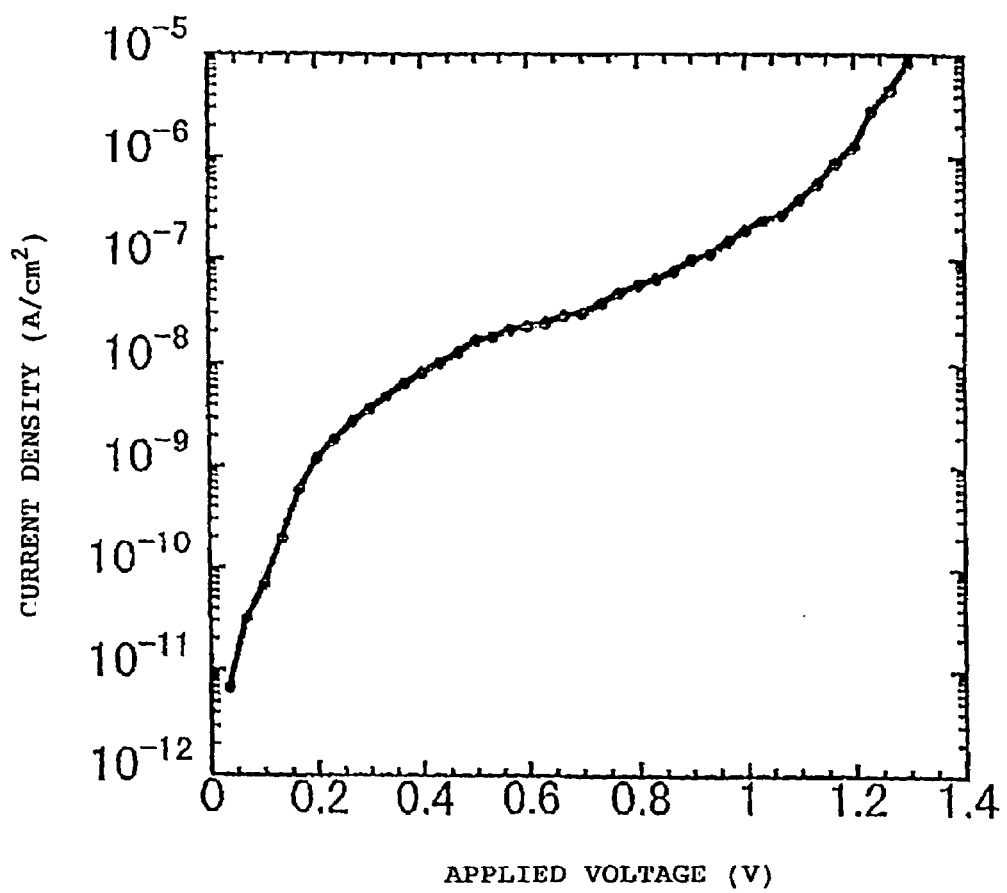
FIG. 8 is a graph showing a relationship between an applied voltage and a leakage current density for a laminar structure consisting of a tantalum-tungsten oxide film crystal and a silicon nitride used in a semiconductor device according to this invention.

FIG. 8 shows dependence of a leakage current density on an applied voltage in the tantalum-molybdenum oxide film crystal (Mo/(Ta+Mo)=about 1%) on a silicon nitride film thus obtained.

As seen in FIG. 8, a leakage current density at an applied voltage of 1.2 V is $10^{-6}$ $A/cm^2$ or less, which is about $10^{-5}$ times or less compared with a $Ta_2O_5$ crystal.

The above tantalum-tungsten or tantalum-molybdenum oxide film crystal can be used as a gate insulating film to meet an insulating property required for a gate insulating film in a semiconductor transistor with a 0.05 μm generation of gate length (a leakage current density of $10^{-6}$ $A/cm^2$ or less at 1.2 V when an equivalent oxide thickness is 0.5 nm).

Reduction of oxygen defects compared with a $Ta_2O_5$ in the film due to the presence of tungsten or molybdenum may contribute improvement in insulating performance compared with a $Ta_2O_5$, i.e., reduction in a leakage current, when a tungsten or molybdenum content is equal to or less than a certain level in a oxide crystal of $Ta_2O_5$ and $WO_3$, $xTa_2O_5$-$yWO_3$ or $Ta_2O_5$ and $MoO_3$, $xTa_2O_5$-$yMoO_3$.

It may be speculated that the leakage current is reduced by adding $WO_3$ or $MoO_3$ to a $Ta_2O_5$ crystal because in a Ta site, Ta is replaced with $W^{6+}$ (ion radius: 0.060 nm) or $Mo^{6+}$ (ion radius: 0.059 nm) having a smaller ion radius in a hexa-coordination state than that of $Ta^{5+}$ ion, 0.064 nm, so that distortion within a crystal is reduced to inhibit formation of oxygen holes during crystallization.

In a oxide crystal of $Ta_2O_5$ and $WO_3$, i.e., $xTa_2O_5yWO_3$, deterioration in an insulating property compared with $Ta_2O_5$ when the amount of tungsten is over a certain value may be caused by segregation of crystallized $WO_3$ with a lower specific resistance (γ-$WO_3$) to, e.g., a grain boundary or by action as a donor of tungsten substituted for a tantalum site in a oxide.

As seen in FIGS. 5 and 6, in a tantalum-tungsten oxide film crystal, a dielectric constant increases as a tungsten content increases. It is because a tantalum-tungsten oxide film crystal has good crystallinity since a $Ta_2O_5$ crystal has almost the same structure as that around a metal atom in γ-$WO_3$, and a large dielectric constant of 2,000 in γ-$WO_3$.

When using a (100) Si substrate, a (100) Si substrate with a silicon oxide film, a (100) Si substrate with a silicon oxynitride film or a platinum substrate as a substrate, leakage current density property and dependence of a dielectric constant on a composition were substantially as in deposition on a silicon nitride film.

When depositing a film as a tantalum-tungsten oxide film crystal from the beginning at a deposition temperature for a tantalum-tungsten or tantalum-molybdenum oxide film, leakage current density property and dependence of a dielectric constant on a composition were substantially as in crystallization of an amorphous tantalum-tungsten or tantalum-molybdenum oxide film by nitrogen annealing.

Description 3 of a Deposition Experiment: Properties on (001) Oriented Ru

On (001) oriented Ru was deposited a tantalum-tungsten oxide film crystal (W/(Ta+W)=11.5 atom %) with a thickness of 6.3 nm at a substrate temperature of 500° C., and the film was annealed in $N_2O$ plasma at 350° C. for 3 minutes and then RTN-treated at 800° C. for 1 minute to provide an insulating film. The insulating film was evaluated for its X-ray diffraction and electric properties.

Figure 9:
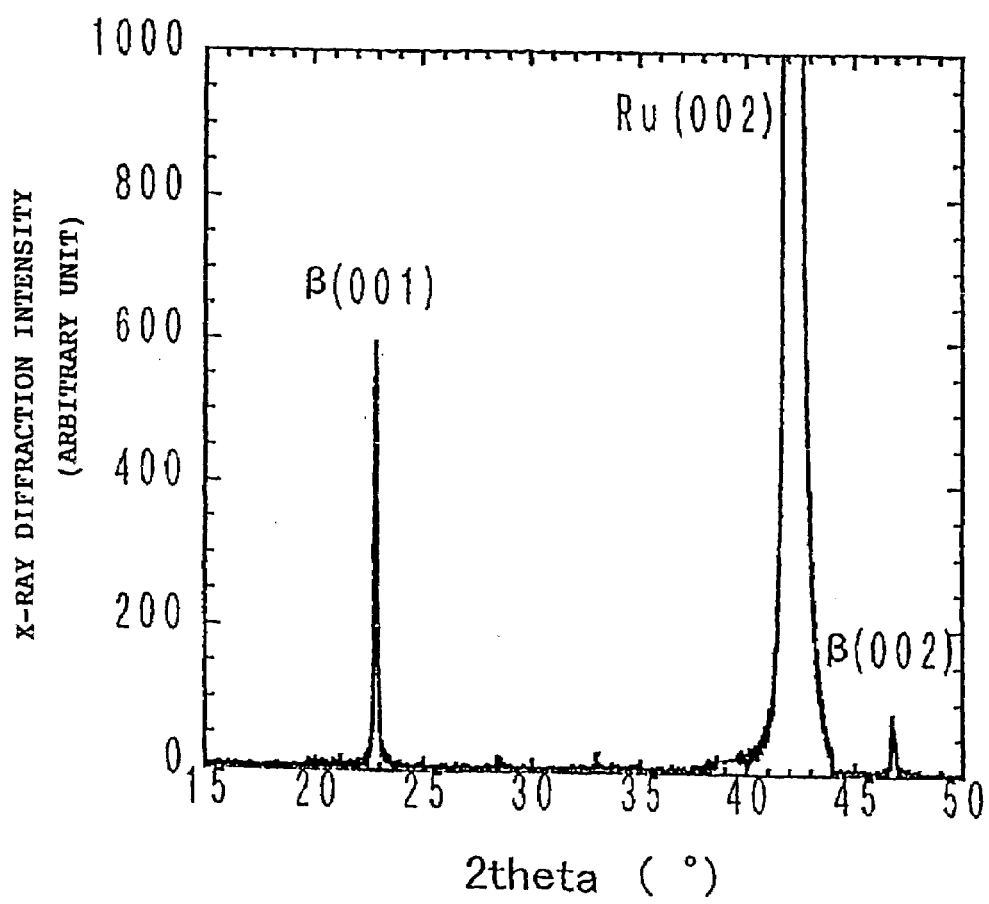
FIG. 9 is a graph showing an X-ray spectrum for a tantalum-tungsten oxide film crystal formed on ruthenium with a (001) orientation.

FIG. 9 shows an X-ray spectrum for the above tantalum-tungsten oxide film crystal, where a symbol to each peak indicates a β-phase tantalum-tungsten oxide or Ru lattice plane. There are peaks at positions indicating the presence of a (001) or (002) oriented tantalum-tungsten oxide film crystal (-$Ta_2O_5$).

Figure 10:
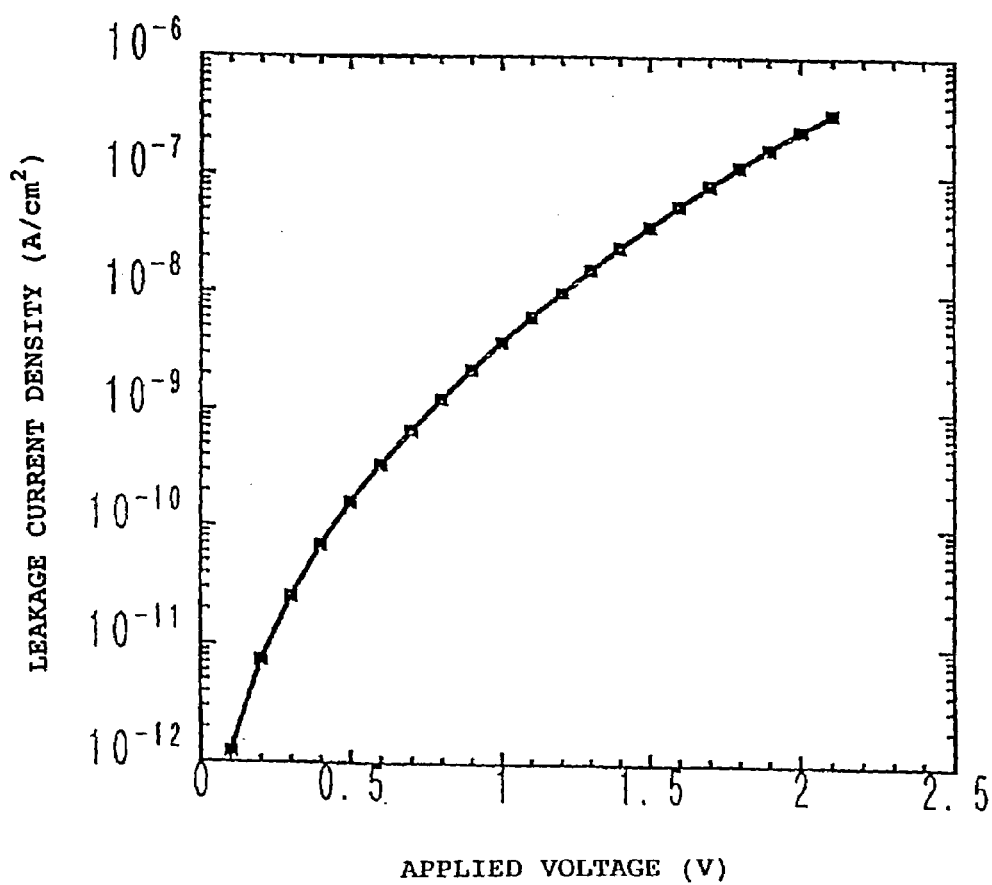
FIG. 10 is a graph showing a relationship between an applied voltage and a leakage current density in a tantalum-tungsten oxide film crystal having a composition illustrated in FIG. 9.

FIG. 10 shows dependence of a leakage current density on an applied voltage in the above tantalum-tungsten oxide film crystal. As seen in FIG. 10, a leakage current density at an applied voltage of 1.2 V is $10^{-8}$ A/cm$^2$ or less, which is due to reduction of oxygen holes in the tantalum-tungsten oxide film crystal compared with tantalum oxide. A dielectric constant for this insulating film was 102, from which an equivalent oxide thickness for the tantalum-tungsten oxide film is estimated to be 0.24 nm. (001) orientation and higher crystallinity in the tantalum-tungsten oxide crystal film contributes to such an increased dielectric constant.

A tantalum-molybdenum oxide crystal film (MO/(Ta+Mo)=about 1 atom %) with a thickness of 6.3 nm (an equivalent oxide thickness is 0.24 nm from a dielectric constant) was deposited on (001) oriented ruthenium (Ru) as described above. For the film, a leakage current density of an applied voltage of 1.2 V and a dielectric constant were $10^{-8}$ A/cm$^2$ or less and 103, respectively.

The tantalum-tungsten or tantalum-molybdenum oxide crystal film can be used as a capacity insulating film to provide a semiconductor memory in which an equivalent oxide thickness is 0.24 nm or less and a leakage current density is $10^{-8}$ A/cm$^2$ when applying 1.2 V to the insulating film.

Application Example 1 to a Gate

Figure 11:
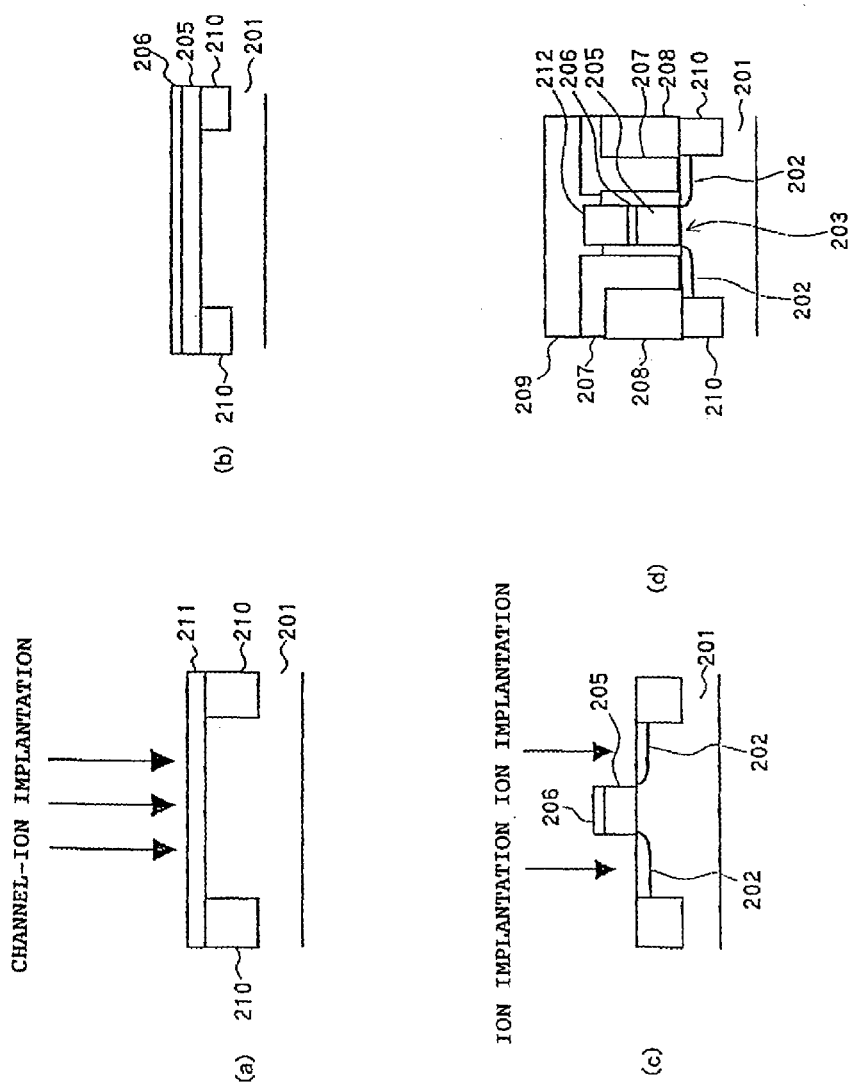
FIG. 11 is a cross section illustrating a process for manufacturing an n-type transistor according to Example 1 for a semiconductor device of this invention.

FIG. 11 shows a process for manufacturing an n-type transistor as the first embodiment for a semiconductor device according to this invention. The structure of the n-type transistor in the first embodiment is shown in FIG. 11(d).

As seen in FIG. 11(d), an STI (Shallow Trench Isolation) structure of device separation region 210 is formed on a substrate 201 consisting of an n-type single crystal silicon with a dopant concentration of about $5\times10^{15}$ cm$^{-1}$. A p-well (not shown) is formed in a device formation region in an n-type transistor. In the n-type transistor region separated by the device separation region 210, there is formed a p-type channel dopant layer (not shown) with a dopant concentration of about $5\times10^{16}$ cm$^{-3}$ for controlling a threshold, over which there is formed a source-drain region 202 consisting of an n-type diffusion layer with a dopant concentration of about $5\times10^{19}$ cm$^{-3}$. On the channel region 203, there is deposited a tantalum-tungsten oxide film (W/(Ta+W)= 11.5%) 205 with a thickness of 10 nm. The tantalum-tungsten oxide film 205 in FIG. 11(d) is crystallized while the tantalum-tungsten oxide film 205 in FIGS. 11(b) and (c) is amorphous.

On the tantalum-tungsten oxide film 205, there is a gate electrode consisting of titanium nitride (TiN) 206 and tungsten (W) 212 in a self-aligned manner to the source-drain region 202. The source-drain region 202 is connected with a source-drain electrode 207 via a contact hole formed in the interlayer insulating film 208. There is formed a passivation film 209 consisting of a silicon oxide or silicon oxynitride film, covering the source-drain electrode 207, the interlayer insulating film 208 and the gate electrode.

There will be described a process for manufacturing the n-type transistor of the first embodiment shown in FIG. 11.

The surface of the n-type single crystal silicon substrate 201 is washed by a washing process using an aqueous mixture of hydrogen peroxide, ammonia and hydrochloric acid. Herein, another washing process may be employed because it is for washing the substrate 201.

On the substrate 201 are a p-well and then a groove using a RIE (Reactive Ion Etch) technique. In the groove is formed an insulating film as a buried trench type of device separating region 210. Then, a silicon oxide film 211 with a thickness of about 5 nm is deposited and channel-ion implanting is conducted to form a p-type channel dopant layer (not shown). The p-type channel dopant layer is activated by RTA (Rapid Thermal Anneal) at 800° C. for about 10 sec (FIG. 11(a)).

The silicon oxide film 211 is etched off with hydrofluoric acid, and a tantalum-tungsten oxide film (W/(Ta+W)= 11.5%) 205 is deposited to a thickness of 5 nm by reactive sputtering without heating the substrate 201 to form TiN 206 on the tantalum-tungsten oxide film 205 (FIG. 11(b)).

Then, on TiN 206 is formed a photoresist pattern (not shown). Anisotropic etching using the pattern as a mask is conducted to pattern each of TiN 206 and the tantalum-tungsten oxide film 205.

When employing an etcher using helicon plasma in etching of TiN 206, an etching gas is a mixture of $SF_6$/Ar (a partial pressure ratio of $SF_6$/Ar is 10/1). An RF supply for generating plasma (13.56 MHz) has a power of about 400 W, a bias supply (13.56 MHz) to the substrate 201 under the tantalum-tungsten oxide film 205 has a power of about 400 W, and a substrate temperature is kept at about 0° C.

On the other hand, when employing a parallel-plate type of etcher for etching of the tantalum-tungsten oxide film 205, an etching gas is $CF_3Cl$, an RF source (13.56 MHz) for applying a high frequency to the parallel plate electrode has a power of about 1500 W, and a substrate temperature is kept at about 60° C.

Then, dopant ions (arsenic ions) are implanted to the substrate 201, using the photoresist pattern, TiN 206 and the tantalum-tungsten oxide film 205 as a mask for ion implantation, to form a source-drain region 202 in a self-aligned manner to TiN 206 and the tantalum-tungsten oxide film 205 (FIG. 11(c)).

The photoresist pattern is removed and heating (1 atm nitrogen atmosphere, 800° C., 10 minutes) is conducted for activating the source-drain. The process is also for crystallizing the tantalum-tungsten oxide film 205.

Then, on the substrate 201 is deposited an interlayer insulating film 208; on the interlayer insulating film 208 are formed contact holes reaching the source-drain region 202 and TiN 206; then the contact hole reaching the source-drain region is filled with Co and TiN (not shown); the contact hole reaching TiN 206 is filled with W; the product is RTA-treated under an atmosphere of nitrogen at 700° C. for 10 sec; and it isputterned to form a source-drain electrode 207 and a gate electrode consisting of TiN 206 and W 212.

It is annealed under an atmosphere of nitrogen and hydrogen (9:1) at 400° C. for 10 minutes, and finally a passivation film 209 is formed over the whole surface (FIG. 11(d)).

In the n-type transistor thus prepared, a threshold is significantly deviated from a designed value due to metal diffusion from the tantalum-tungsten oxide film 205 to the channel region 203. Moreover, metal atoms diffused into the channel cause decrease of atom mobility in the channel, and thus a current ION in the channel region 203 when the transistor is ON fails to reach the designed value.

For minimizing such metal diffusion into the channel region, on the channel region is deposited a silicon oxynitride film 204 with a thickness of 0.7 nm (an equivalent oxide thickness of 0.5 nm) as is in the n-type transistor in the second embodiment shown in FIG. 12(d), on which is formed a tantalum-tungsten oxide film (W/(Ta+W)=11.5%) 205 with a thickness of 5 nm. The laminated film is used as a gate insulating film.

Thus, the silicon oxynitride film 204 acts as a barrier for preventing metal diffusion into the channel region, to prevent a threshold from deviating from the designed value and an ON current ION from decreasing.

The n-type transistor of the second embodiment shown in FIG. 12(d) is prepared as described for the n-type transistor of the first embodiment shown in FIG. 11, except that a silicon oxynitride film 204 is formed before forming the tantalum-tungsten oxide film 205 (see FIG. 12(b)). The process will not be, therefore, described.

A gate capacity per a unit area for the n-type transistor of the second embodiment shown in FIG. 12(d) is 4.0 [μFrad/cm$^2$], which is higher than an expected gate capacity per a unit area of 3.6 [μFrad/cm$^2$] when an equivalent oxide thickness of the gate insulating film is 1.0 nm. In other words, an equivalent oxide thickness for the gate insulating film in the n-type transistor prepared is 1.0 nm or less.

Figure 13:
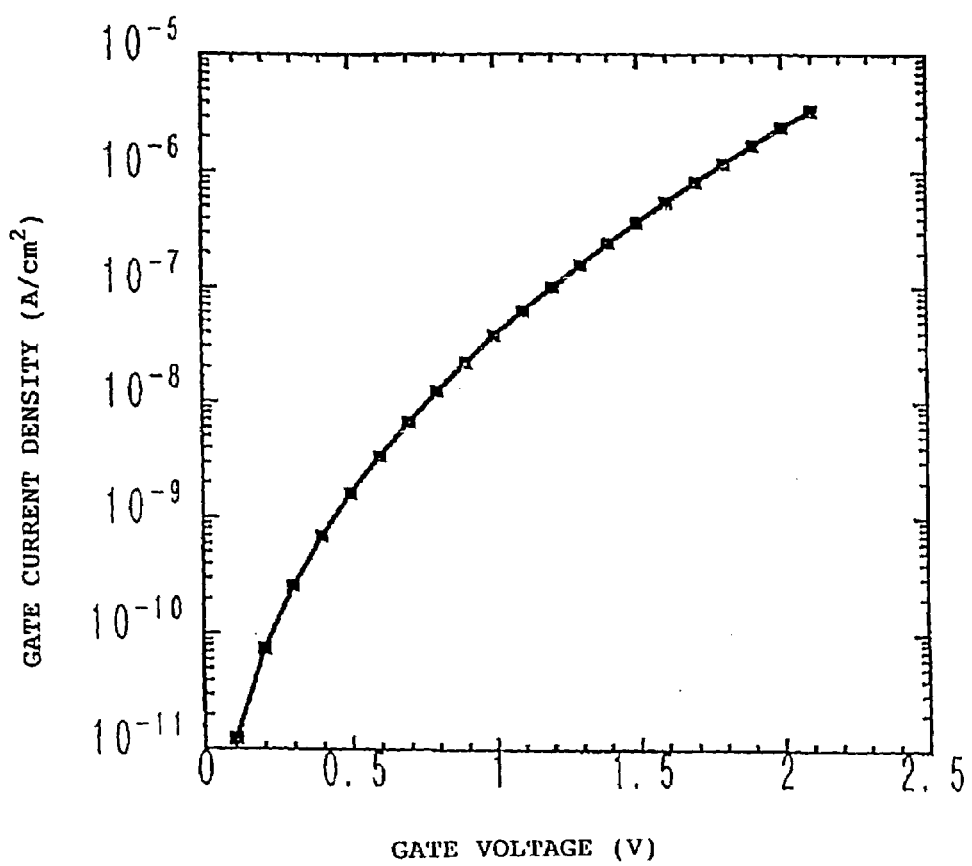
FIG. 13 is a graph showing a relationship between a gate voltage and a gate leakage current density in the n-type transistor in FIG. 12.

FIG. 13 shows dependence of a gate leakage current density on a gate voltage in the n-type transistor of the second embodiment. As seen in FIG. 13, a leakage current density at a gate voltage of 1.2 V in the n-type transistor of the second embodiment is $10^{-7}$ A/cm$^2$. In the n-type transistor of the second embodiment, an interface state density of an interface between the gate insulating film and silicon is $5 \times 10^{10}$/cm$^2$ev, which is substantially comparable to an interface state density of an interface between a silicon oxide film formed as usual and silicon. Thus, the n-type transistor of the second embodiment was found to normally operate.

Application Example 2 to a Gate

Figure 14:
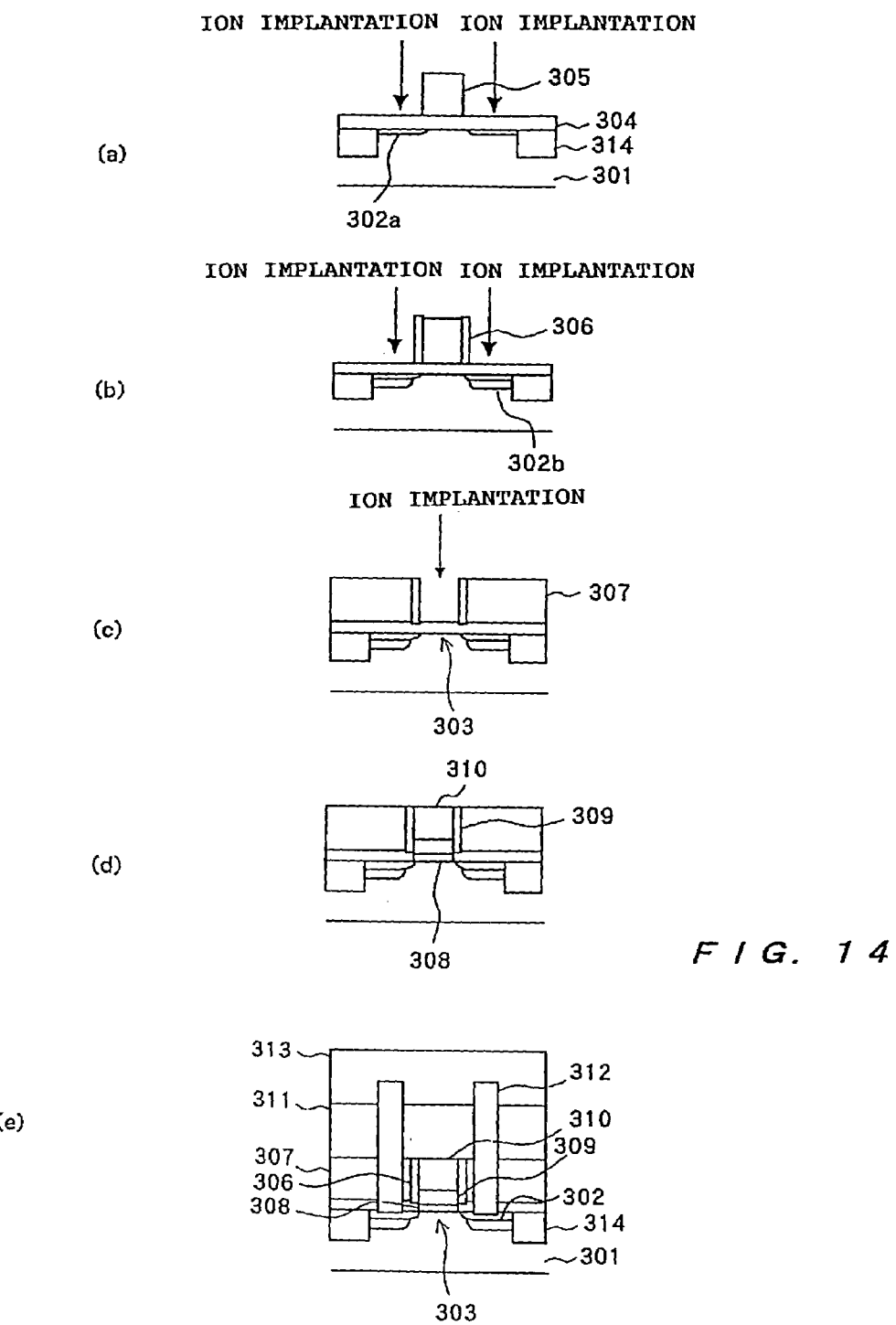
FIG. 14 is a cross section illustrating a process for manufacturing an n-type transistor according to Example 3 for a semiconductor device of this invention.

FIG. 14 shows a process for manufacturing an n-type transistor as the third embodiment for a semiconductor device according to this invention. The structure of the n-type transistor in the third embodiment is shown in FIG. 14(e).

As seen in FIG. 14(e), an STI (Shallow Trench Isolation) structure of device separation region 314 is formed on a substrate 301 consisting of an n-type single crystal silicon with a dopant concentration of about $5 \times 10^{15}$ cm$^{-3}$. A p-well (not shown) is formed in a device formation region in an n-type transistor. In the n-type transistor region separated by the device separation region 314, there is formed a source-drain region 302 consisting of n-type diffusion layers having an LDD (Lightly Doped Drain) structure p-type with dopant concentration of about $5 \times 10^{19}$ cm$^{-3}$ and about $5 \times 10^{20}$ cm$^{-3}$. Furthermore, there is selectively formed a p-type channel dopant layer (not shown) with a dopant concentration of about $5 \times 10^{16}$ cm$^{-3}$ for controlling a threshold, only in a channel region 303.

On the channel region 303, there is deposited a silicon oxynitride film 308 with an equivalent oxide thickness of 0.5 nm, on which there is then formed a tantalum-tungsten oxide crystal film (W/(Ta+W)=11.5%) 309 with a thickness of 5 nm. On the tantalum-tungsten oxide crystal film 309, there is a gate electrode 310 consisting of titanium nitride (TiN) and tungsten (W) in a self-aligned manner to the source-drain region 302. There is formed a silicon oxide film 306 between the tantalum-tungsten oxide crystal film 309 and the first interlayer insulating film 307. The source-drain region 302 is connected with a source-drain electrode 312 via contact holes formed in the first interlayer insulating film 307 and the second interlayer insulating film 311 thereon. There is formed a passivation film 313 consisting of a silicon oxide or silicon oxynitride film, covering the source-drain electrode 312 and the second interlayer insulating film.

There will be described a process for manufacturing the n-type transistor of the third embodiment shown in FIG. 14.

The surface of the n-type single crystal silicon substrate 301 is washed by a washing process using an aqueous mixture of hydrogen peroxide, ammonia and hydrochloric acid. Herein, another washing process may be employed because it is for washing the substrate 301.

On the substrate 301 are a p-well and then a groove using a RIE technique. In the groove is formed an insulating film as a buried trench type of device separating region 314. Then, on the substrate 301 is formed a silicon oxide film 304 with a thickness of about 5 nm. On the whole surface of the silicon oxide film 304 is then deposited a polycrystalline silicon film to a thickness of about 300 nm, which is then subject to lithography and RIE technique to give a dummy gate pattern 305. A polycrystalline silicon is used for the dummy gate pattern 305 because a ratio to the silicon oxide film 304 can be readily selected to minimize etching damage to the silicon substrate 301 by RIE.

Then, for forming an LDD structure, phosphorous ions are implanted under the conditions of 70 KeV and about $4 \times 10^{13}$ cm$^{-2}$ using the dummy gate pattern 305 consisting of a polycrystalline silicon film, to form an n$^-$-type diffusion layer 302a as a part of the source-drain region 302 (FIG. 14(a)).

Subsequently, after depositing the silicon oxide film over the whole surface, it is removed by RIE technique to form a silicon oxide film 306 with a thickness of about 20 nm on a side wall of the dummy gate pattern 305. Then, arsenic ions are implanted under the conditions of 30 KeV and about $5 \times 10^{15}$ cm$^{-2}$ to form an n$^+$-type diffusion layer 302b as a part of the source-drain region 302 (FIG. 14(b)).

Over the whole surface is deposited a silicon oxide film to about 300 nm which is to be the first interlayer insulating film 307, by CVD, and it is then annealed under a nitrogen atmosphere at 950° C. for 30 minutes. Subsequently, it is subject to RTA under a nitrogen atmosphere at 950° C. for 10 sec to activate the ion-implantation layer in the source-drain region 302.

Then, the whole surface is flattened by CMP (Chemical Mechanical Polishing) to expose the surface of the dummy gate pattern consisting of a polycrystalline silicon film. The exposed dummy gate pattern 305 is selectively removed by RIE to expose the surface of the silicon oxide film 304.

Then, ions are implanted in a desired channel region 303 using the first interlayer insulating film 307 and the side-wall insulating film 306 as a mask. For setting a threshold to about 0.7 V in an n-channel transistor, boron ions are implanted under the conditions of 10 KeV and about $5 \times 10^{12}$ cm$^{-2}$ to form a p-type channel selectively in the channel region 303 (FIG. 14(c)).

The silicon oxide film 304 is removed with diluted hydrofluoric acid. On the exposed surface of the substrate 301 is formed a silicon oxynitride film 308 with an equivalent oxide thickness of 0.5 nm by rapid oxynitriding at 1000° C. for 1 sec using nitrogen monoxide. Then, over the whole surface is formed a tantalum-tungsten oxide film (W/(Ta+W)=11.5%) with a thickness of 5 nm at a substrate temperature of 500° C. by reactive sputtering.

The product is subject to RTA under a nitrogen atmosphere at 800° C. for 10 sec to activate dopants in the channel region 303. The process is also for crystallizing the tantalum-tungsten oxide film. The process reduces the number of non-terminated bonds present in the interface between the substrate 301 and the silicon oxynitride 308, leading to reduction in an interface state density. The tantalum-tungsten oxide crystal film 309 and the silicon oxynitride film 308 become gate insulating films.

Over the whole surface are deposited TiN and W, and the whole surface is subject to CMP to embed a gate electrode 310 in a groove formed after removal of the dummy gate pattern 305 (FIG. 14(d)).

Then, over the whole surface is deposited a silicon oxide film as the second interlayer insulating film 311 to about 200 nm to form a contact hole reaching the source-drain region 302.

Subsequently, Co, TiN and W are separately deposited. After RTA (Rapid Thermal Anneal) under a nitrogen atmosphere at 700° C. for 10 sec, these are patterned to form a source-drain electrode 312. The product is annealed under an atmosphere of nitrogen and hydrogen (9:1) at 400° C. for 10 minutes, and finally a passivation film 313 is formed over the whole surface.

Preparation of a transistor according to the above process has the following three advantages.

First, this process allows a channel-ion implanting layer for adjusting a threshold to be selectively formed in the channel region 303, leading to reduction in a junction leakage current between source-drains. Secondly, a channel-ion implanting layer can be formed before heating at an elevated temperature, so that a sharp dopant profile can be maintained to effectively inhibit a short channel effect. Thirdly, using CMP rather than RIE conventionally used for processing a gate electrode allows us to avoid damage to a gate insulating film due to plasma observed during RIE.

Figure 12:
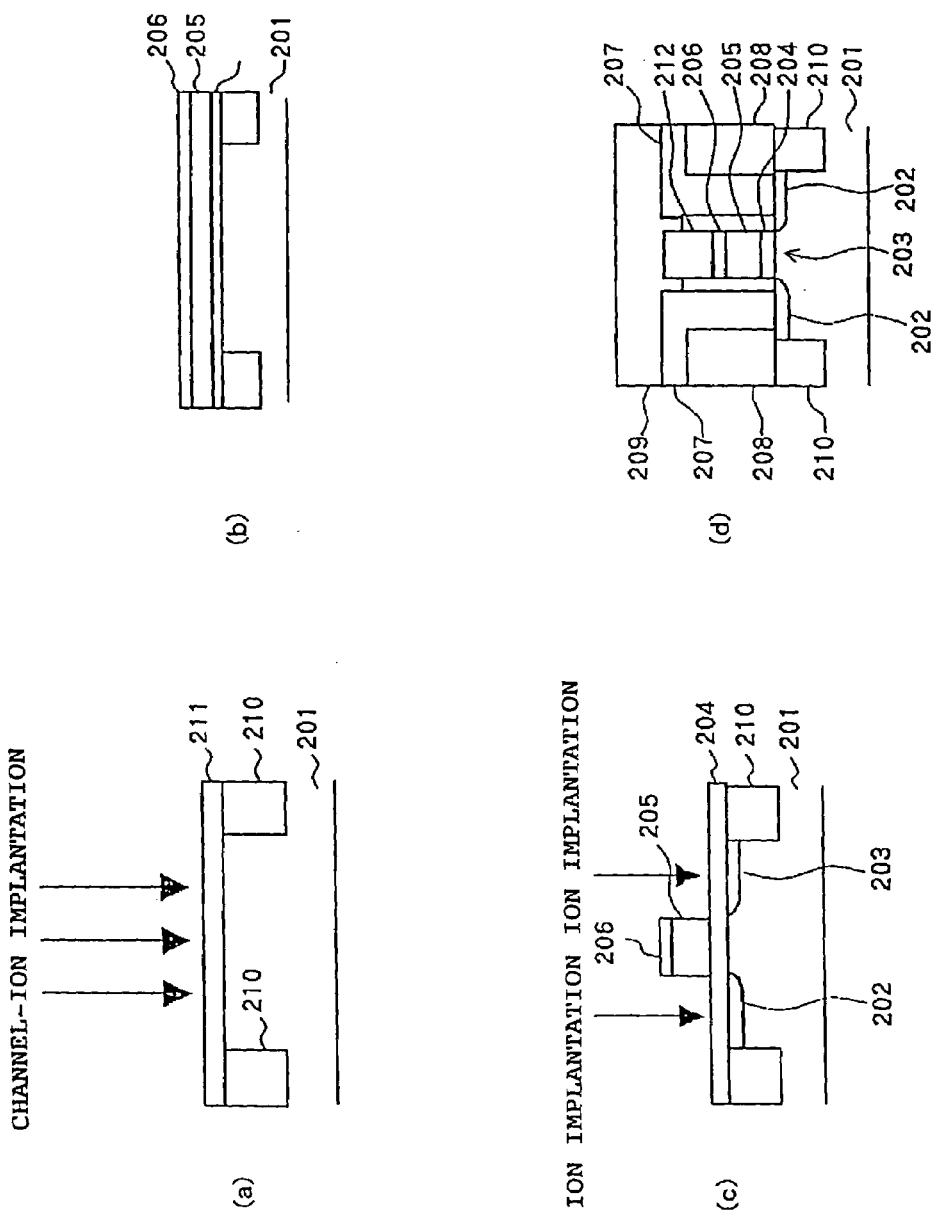
FIG. 12 is a cross section illustrating a process for manufacturing an n-type transistor according to Example 2 for a semiconductor device of this invention.

We have confirmed that a transistor according to this manufacturing process exhibits performance comparable to that for the n-type transistor in the second embodiment shown in FIG. 12 and satisfactorily operates.

As described above, a semiconductor device of this invention may provide a field-effect transistor in which a gate insulating film has a Si-oxide-film reduced thickness of 1 nm or less and a gate leakage current at a gate voltage of 1.2 V is $10^{-6}$ A/cm$^2$ or less. We have confirmed that similar effects can be achieved using a tantalum-molybdenum oxide crystal film instead of a tantalum-tungsten oxide crystal film. In addition to a silicon oxynitride film, a silicon oxide or silicon nitride film may be used as a barrier film for preventing diffusion of metal into a channel. Not limited to reactive sputtering, a tantalum-tungsten oxide crystal film may be formed by thermal oxidation, CVD(Chemical Vapor Deposition) or anodic oxidation where a substrate temperature is set to 450° C. or lower during deposition, as long as oxidation can be inhibited immediately under a tantalum-tungsten oxide film.

Furthermore, a gate electrode may not be limited to a TiN laminated film, but made of a material which is not oxidized by oxygen annealing; a noble metal whose oxide is electrically conductive, such as Ir, Pt, Ru, Os and Rh; a high-melting metal compound TiN; or a conductive oxide such as $RuO_2$, $RhO_2$, $OsO_2$, $IrO_2$, $ReO_3$ and $SrRuO_3$; or a laminated film consisting of two or more layers of these materials.

We have confirmed that similar effects to the transistor in the second or third embodiment may be achieved by appropriately combining the barrier film, the process for forming a tantalum-tungsten oxide crystal film, the annealing process and the gate electrode materials described above.

Application Example 1 to a Memory

There will be described a semiconductor device of this invention, using a semiconductor memory as a specific example.

Figure 15:
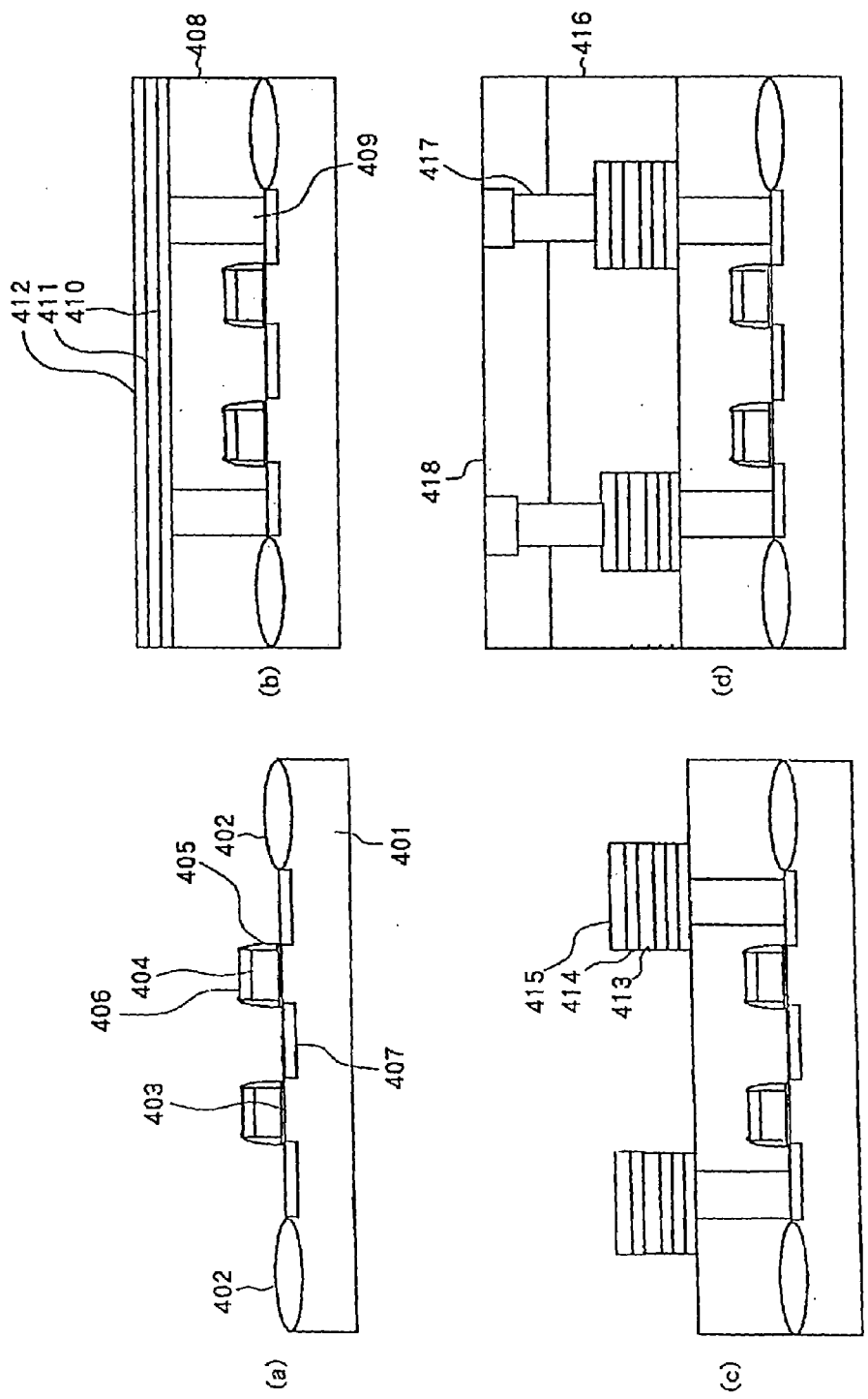
FIG. 15 is a cross section illustrating a process for manufacturing a semiconductor memory according to Example 4 for a semiconductor device of this invention.

FIG. 15 illustrates a process for manufacturing a semiconductor memory according to the fourth embodiment for a semiconductor device of this invention. In this example, there will be described only a process for manufacturing a semiconductor memory of the fourth embodiment, whose structure is shown in FIG. 15(d).

The surface of an n-type single crystal silicon substrate 401 is washed by a washing process using an aqueous mixture of hydrogen peroxide, ammonia and hydrochloric acid. Herein, another washing process may be employed because it is for washing the substrate 401.

On the substrate 401 are formed a LOCOS type of device-separating region 402 and then a silicon oxide film with a thickness of 5 nm. On the substrate 401 are formed n-type and p-type wells by ion-implanting with, for example, boron and phosphorous, respectively.

Then, the silicon oxide film is removed with, e.g. hydrofluoric acid and a gate oxide film 403 is formed by wet oxidation. On the gate oxide film 403 is deposited a polycrystalline silicon 404 to be a part of a gate electrode, which is then etched. On the polycrystalline silicon 404 is deposited a silicon oxide film and is then formed a sidewall oxide film 405 by etching.

After ion-implanting with dopants such as boron and arsenic, RTA is conducted under a nitrogen atmosphere at 950° C. for 10 sec to form an n-type and a p-type diffusion layers. Then, over the whole surface is deposited Ti which is then reacted with silicon. Unreacted Ti is etched off to form Ti silicide 406 to be a part of a gate electrode and a diffusion layer 407 made of Ti silicide. Thus, n-type or p-type MOS transistors mutually separated with the LOCOS type of device-separating region 402 are formed as illustrated in FIG. 15(a).

After depositing a silicon oxide film or a silicon oxide film doped with boron or phosphorous (BPSG) as the first interlayer insulating film 408, the surface is flattened by CMP. Then, in the first interlayer insulating film 408 is formed a contact hole, and are deposited Ti and TiN as a barrier metal, on which is then deposited tungsten by CVD and is formed a plug 409 made of tungsten by CMP. The plug 409 may be formed by etching back after depositing tungsten by CVD.

On the plug 409 are sequentially deposited a titanium (Ti) film 410 and a titanium nitride (TiN) film 411 to be a lower electrode by sputtering, on which is then formed a ruthenium (Ru) film 412 to 200 nm (FIG. 15(b)). During depositing the Ti film 410, the TiN film 411 and the Ru film 412 to be a lower electrode, a temperature of the substrate 401 is 100° C., 100° C. and 350° C., respectively. Setting a temperature of the substrate 401 as described above may improve crystallinity of the TiN film 411 and the Ru film 412 and may control the Ru film 412 to (002) orientation.

Then, over the whole surface is deposited a tantalum-tungsten oxide film (W/(Ta+W)=11.5%) to a thickness of 6.3 nm by reactive sputtering at a substrate temperature of 500° C. to form a capacity insulating film 413. After annealing in $N_2O$ plasma at 350° C. for 3 minutes, the product is subject to RTN at 800° C. for 1 minute. This post-treatment may provide a highly (001)-oriented crystalline tantalum-tungsten oxide film.

Then, over the whole surface are deposited a titanium nitride (TiN) film 414 and a tungsten (W) film 415 as an upper electrode. The upper electrode 414, 415, the capacity insulating film 413 and the lower electrode 410 to 412 are mutually separated by patterning using dry etching (FIG. 15(c)).

When employing an etcher using helicon plasma in etching of the upper electrode 414, 415 and the lower electrode 410 to 412, an etching gas is a mixture of $SF_6/Ar$ (a partial pressure ratio of $SF_6/Ar$ is 10/1); an RF supply for generating plasma (13.56 MHz) has a power of about 400 W, a bias supply (13.56 MHz) applied to the substrate has a power of about 400 W, and a substrate temperature is kept at about 0° C.

When employing a parallel-plate type of etcher for etching of the capacity insulating film 413, an etching gas is $CF_3Cl$, an RF source (13.56 MHz) for applying a high frequency to the parallel plate electrode has a power of about 1500 W, and a substrate temperature is kept at about 60° C.

A silicon oxide film is deposited as the second interlayer insulating film 416 by plasma CVD and then a capacity upper contact and a plate-line contact are opened by etching. Then, WSi, TiN, AlCu, TiN as a metal interconnect 417 are sequentially deposited by sputtering and then processed by etching. On the surface is deposited a silicon oxide or nitride film as a passivation film 418 and an electrode pad is opened for evaluating electric properties.

Figure 16:
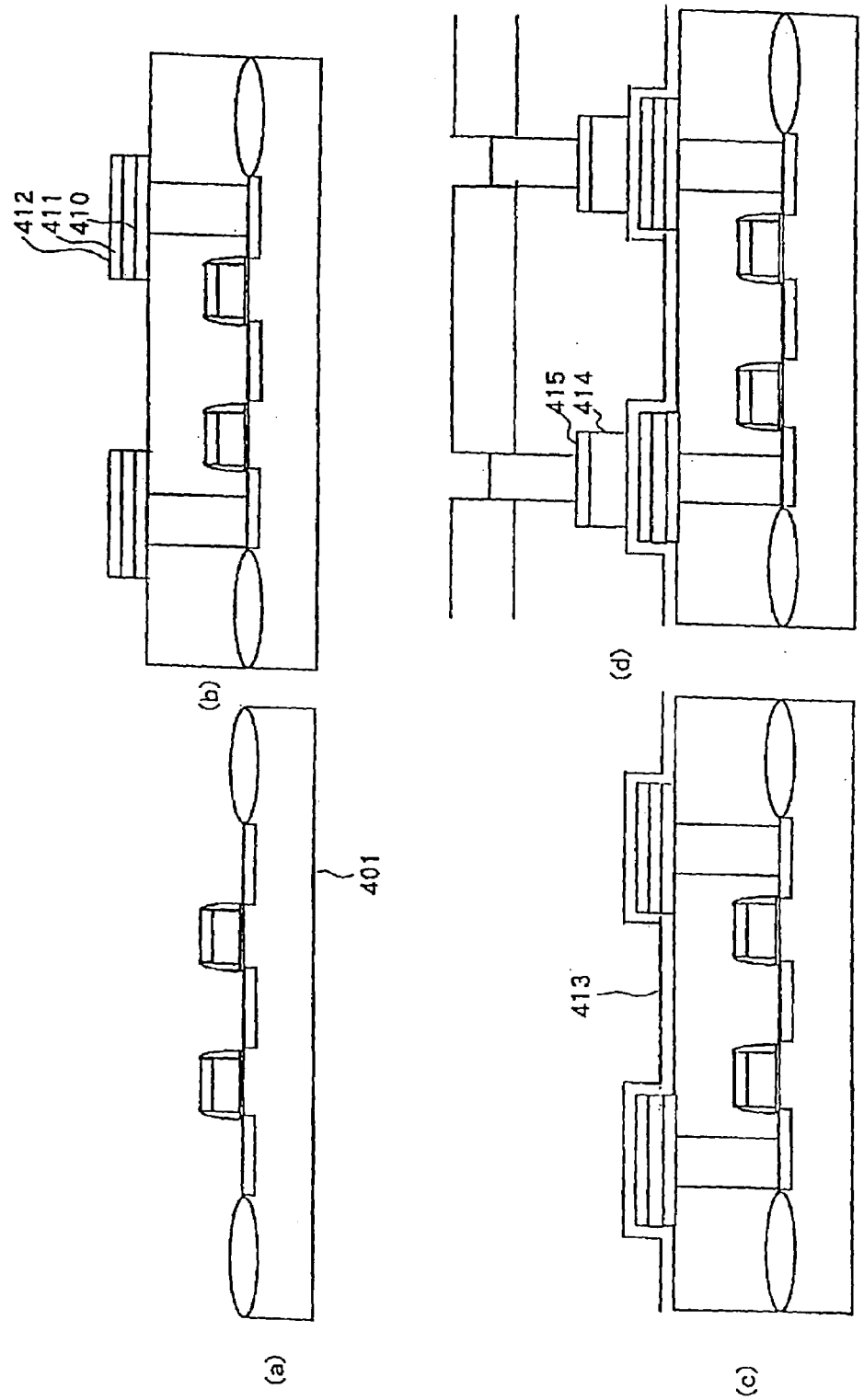
FIG. 16 is a cross section showing a modified process for manufacturing the semiconductor memory in FIG. 15.

For the semiconductor memory of the fourth embodiment, FIG. 15 illustrates a process where a capacity is separated by dry etching after forming the lower electrode 410 to 412 in the capacitor, the capacity insulating film 413 consisting of a tantalum-tungsten oxide film and the upper electrode 414, 415. It may be, however, possible to first separate the lower electrodes in the capacitor, i.e., the Ru film 412, the TiN film 411 and the Ti film 410 by etching; to deposit a tantalum-tungsten oxide film and then to separate the upper electrodes as illustrated in FIG. 16. When conducting etching of the upper electrode 414 with an etcher using the above helicon plasma, a mixture of $SF_6/Ar$ may be preferably used as an etching gas. By this process, a film to be dry-etched may be thinner, leading to forming a finer pattern. A side of the tantalum-tungsten oxide film is not exposed in the plasma. There may be generated no defects in a capacity insulating film consisting of a tantalum-tungsten oxide film.

There will be described electric properties for a capacitor in the semiconductor memory of the fourth embodiment illustrated in FIG. 15. Herein, the electric properties for the capacitor in the semiconductor memory illustrated in FIG. 16 were substantially comparable to those for the capacitor in the semiconductor memory of the fourth embodiment illustrated in FIG. 15. A measured capacity per a unit area for the capacitor is 15 [µFrad/cm$^2$], which is comparable to a desired capacity per a unit area when the capacity insulating film 413 has a silicon reduced thickness of 0.24 nm, where the tantalum-tungsten oxide film has a dielectric constant of 107. In other words, the capacity insulating film thus prepared has a silicon reduced thickness of 0.24 nm.

Figure 17:
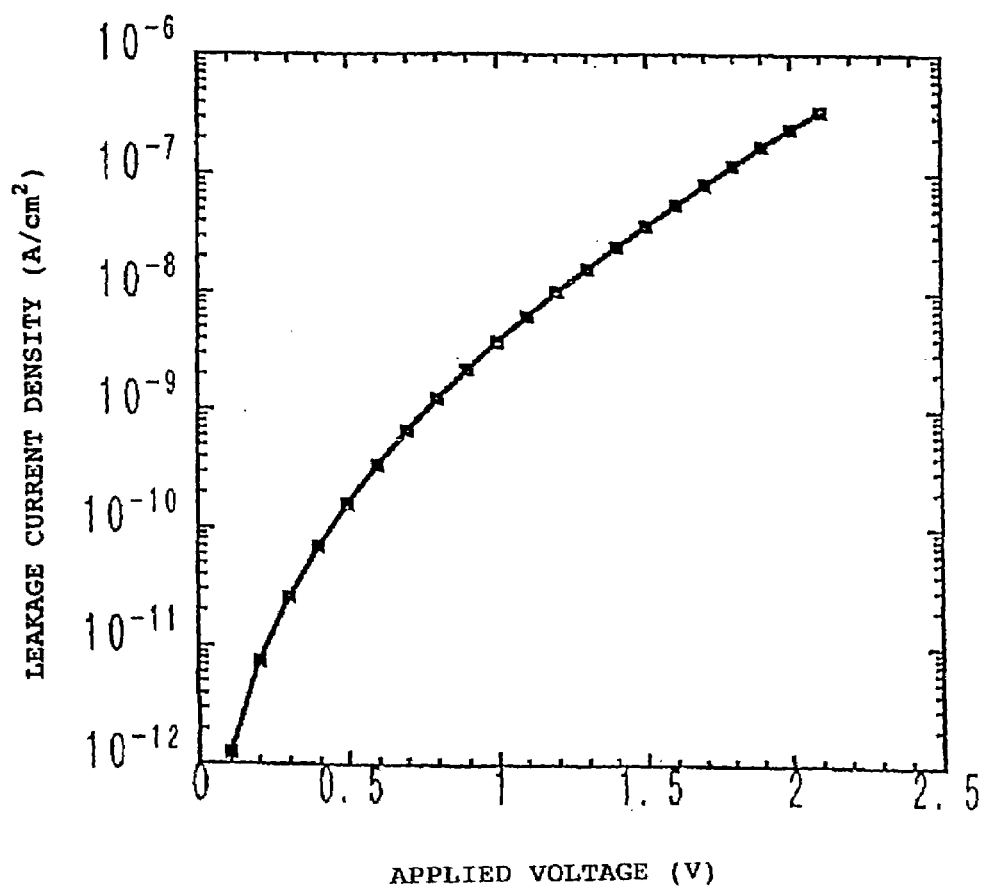
FIG. 17 is a graph showing an applied voltage to a capacity insulating film and a leakage current density in the semiconductor memory in FIG. 15.

FIG. 17 shows dependence of a leakage current density on an applied voltage in the capacity insulating film in the semiconductor memory illustrated in FIG. 15. As seen in FIG. 17, the semiconductor memory of the fourth embodiment has a leakage current density of $10^{-8}$ A/cm$^2$ at an applied voltage of 1.2 V.

Application Example 2 to a Memory

Figure 18:
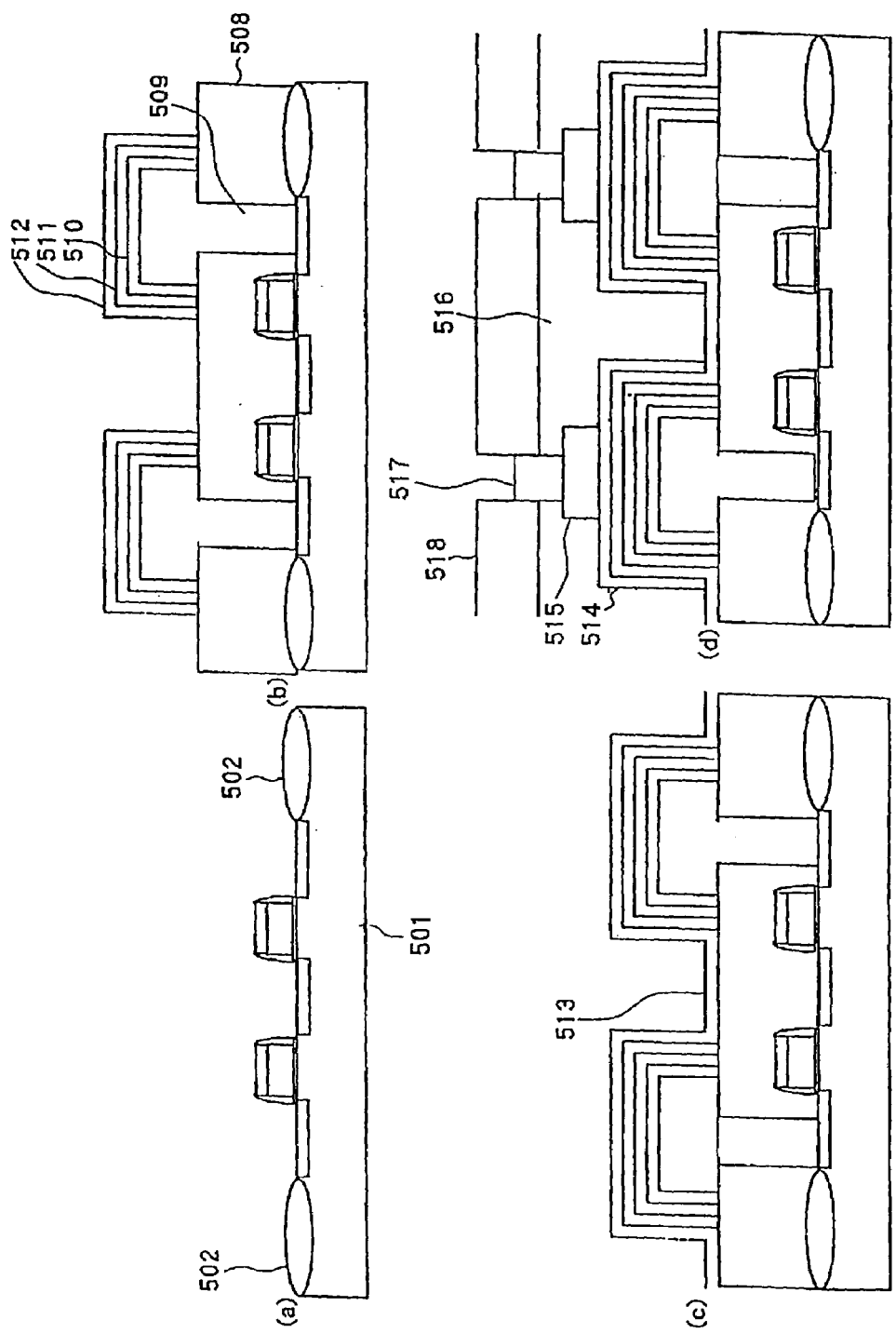
FIG. 18 is a cross section illustrating a process for manufacturing a semiconductor memory according to Example 5 for a semiconductor device of this invention.

FIG. 18 illustrates a process for manufacturing a semiconductor memory according to the fifth embodiment for a semiconductor device of this invention. In this example, there will be described only a process for manufacturing a semiconductor memory of the fifth embodiment, whose structure is shown in FIG. 18(d).

As described for the semiconductor memory of the fourth embodiment, on a substrate 501 are formed n-type or p-type MOS transistors mutually separated with LOCOS type of device-separating regions 502.

After depositing a silicon oxide film or a silicon oxide film doped with boron or phosphorous (BPSG) as the first interlayer insulating film 508, the surface is flattened by CMP. Then, in the first interlayer insulating film 508 is formed a contact hole, and are deposited Ti and TiN as a barrier metal, on which is then deposited tungsten (W) and is formed a plug 509 by etching. On the plug are sequentially deposited a Ti film 510 and a TiN film 511 by CVD to be a lower electrode, on which is then formed a Ru film 512 to 200 nm by CVD (FIG. 18(b)). During depositing the Ti film 510, the TiN film 511 and the Ru film 512, a substrate temperature is 100° C., 100° C. and 350° C., respectively. Setting a substrate temperature as described above may improve crystallinity of the TiN film 511 and the Ru film 512 and may control the Ru film 512 to (001) orientation.

Then, over the whole surface is deposited a tantalum-tungsten oxide film (W/(Ta+W)=11.5%) to a thickness of 6.3 nm to be a capacity insulating film 513 by MOCVD at a substrate temperature of 500° C. (FIG. 18(c)). After annealing in $N_2O$ plasma at 350° C. for 3 minutes, the product is subject to RTN at 800° C. for 1 minute. This post-treatment may provide a highly (001) oriented tantalum-tungsten oxide film.

Then, over the whole surface are deposited a TiN film 514 and a W film 515 to be an upper electrode. The TiN film 514 and the W film 515 are separated by patterning. When employing an etcher using helicon plasma in etching of the upper electrode, an etching gas is a mixture of $SF_6/Ar$ (a partial pressure ratio of $SF_6/Ar$ is 10/1); an RF supply for generating plasma (13.56 MHz) has a power of about 400 W, a bias supply (13.56 MHz) applied to the substrate has a power of about 400 W, and a substrate temperature is kept at about 0° C.

A silicon oxide film is deposited as an interlayer insulating film 516 by plasma CVD and then a capacity upper contact and a plate-line contact are opened by etching. Then, WSi, TiN, AlCu, TiN as a metal interconnect 517 are sequentially deposited by sputtering and then processed by etching. On the surface is deposited a silicon oxide or nitride film as a passivation film 518 and an electrode pad is opened for evaluating electric properties.

A measured capacity per a unit surface area for the capacitor in the semiconductor memory of the fifth embodiment illustrated in FIG. 18 is 15 [µFrad/cm$^2$], which is equivalent to that for the fourth embodiment illustrated in FIG. 15 and which is comparable to a desired capacity per a unit surface area when the capacity insulating film has a silicon reduced thickness of 0.24 nm, where the tantalum-tungsten oxide film has a dielectric constant of 107. In other words, the capacity insulating film thus prepared has a silicon reduced thickness of 0.24 nm.

Figure 19:
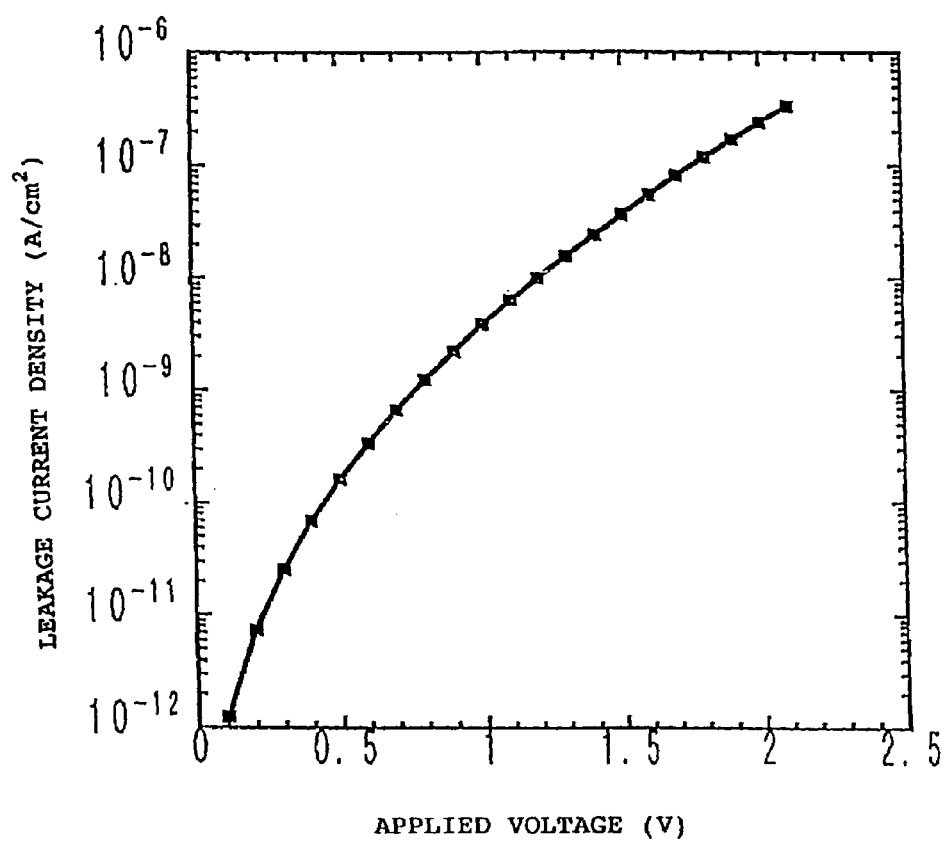
FIG. 19 is a graph showing an applied voltage to a capacity insulating film and a leakage current density in the semiconductor memory in FIG. 18.

FIG. 19 shows dependence of a leakage current density on an applied voltage in the capacity insulating film in the semiconductor memory of the fifth embodiment. As seen in FIG. 19, the semiconductor memory of the fifth embodiment has a leakage current density of $10^{-8}$ A/cm$^2$ at an applied voltage of 1.2 V.

Thus, as described in the fourth and the fifth embodiments, the above tantalum-tungsten oxide crystal film may be used as a capacity insulating film in a semiconductor memory to increase an electrostatic capacity in a capacitor without increasing a cell area and therefore, allows a semiconductor memory to be further integrated.

This invention can provide a semiconductor memory in which an equivalent oxide thickness of a capacity insulating film is 0.24 nm or less and a leakage current density is $10^{-8}$ A/cm$^2$ at an applied voltage of 1.2 V to a capacitor, and can provide a further integrated DRAM. The structure of the fifth embodiment may be employed for further integration.

We have confirmed that similar effects can be achieved using a tantalum-molybdenum oxide crystal film instead of a tantalum-tungsten oxide crystal film. The capacity insulating film may be formed by reactive sputtering or CVD (Chemical Vapor Deposition) at a substrate temperature of 650° C. or higher during deposition where the film is deposited as a crystal. Oxygen holes in the crystallized tantalum-tungsten or tantalum-molybdenum oxide film may be compensated by annealing it under an atmosphere of oxygen or a mixture of oxygen and ozone with or without UV irradiation.

We have confirmed that similar effects to the semiconductor memory in the fourth or fifth embodiment may be achieved by appropriately combining the process for forming a tantalum-tungsten oxide film and the annealing process described above.

Furthermore, upper and lower electrodes in a capacitor may not be limited to Ru or a TiN—W laminated film, but made of polycrystalline silicon, a material which is not oxidized by oxygen annealing; a noble metal whose oxide is electrically conductive, such as Ir, Pt, Os and Rh; a conductive oxide such as $RuO_2$, $RhO_2$, $OsO_2$, $IrO_2$, $ReO_3$ and $SrRuO_3$; or a laminated film consisting of two or more layers of these materials.

However, when not using Ru with (001) orientation as a lower electrode, a tantalum-tungsten oxide crystal film exhibits a dielectric constant of about 40, so that a capacity insulating film has an equivalent oxide thickness of 0.6 nm, which is 2.5 times of that when Ru is used as a lower electrode.

While preferred embodiments of the present invention have been described using specific terms, such description is for illustrative purposes only, and it is to be understood that changes and variations may be made without departing from the spirit or scope of the following claims.

What is claimed is:

1. A semiconductor device comprising a tantalum-molybdenum oxide crystal film as an insulating film, which comprises Mo-doped $Ta_2O_5$ crystal.

2. The semiconductor device according to claim 1, wherein said Mo-doped $Ta_2O_5$ crystal contains 2% or less of molybdenum atoms in the total metal atoms.

3. The semiconductor device according to claim 1, where at least one electrode, in contact with said tantalum-molybdenum oxide crystal film, comprises at least one noble metal selected from the group consisting of Ir, Pt, Ru, Os and Rh; a high-melting point metal compound TiN; and a conductive oxide selected from $RuO_2$, $RhO_2$, $OsO_2$, $IrO_2$, $ReO_3$ and $SrRuO_3$.

4. The semiconductor device according to claim 1, where at least one electrode, in contact with said tantalum-molybdenum oxide crystal film, has a laminated structure of at least two noble metals selected from the group consisting of Ir, Pt, Ru, Os and Rh; a high-melting point metal compound TiN; and a conductive oxide selected from $RuO_2$, $RhO_2$, $OsO_2$, $IrO_2$, $ReO_3$ and $SrRuO_3$.

5. The semiconductor device according to claim 1, wherein the insulating film consists of a laminated film comprising at least one of a silicon oxide film, a silicon oxynitride film or a silicon nitride film.

* * * * *

UNITED STATES PATENT AND TRADEMARK OFFICE
CERTIFICATE OF CORRECTION

PATENT NO. : 7,208,787 B2
APPLICATION NO. : 10/242725
DATED : April 24, 2007
INVENTOR(S) : Kenzo Manabe It is certified that error appears in the above-identified patent and that said Letters Patent is hereby corrected as shown below:

Column 13, line 9, before "-Ta$_2$O$_5$" insert -- β --

Column 22, lines 18-19 (claim 9), delete "at least one of the electrodes in contract with said tantalum-molybdenum oxide crystal film comprises" insert -- at least one electrode, in contact with said tantalum-molybdenum oxide film, comprises --

Column 22, lines 22-26 (claim 10), delete "at least one of the electrodes in contact with said tantalum-molybdenum oxide film has" insert -- at least one electrode, in contact with said tantalum-molybdenum oxide crystal film, has --

Signed and Sealed this

First Day of September, 2009

David J. Kappos
*Director of the United States Patent and Trademark Office*